(12) United States Patent
Matsumoto et al.

(10) Patent No.: US 7,168,060 B2
(45) Date of Patent: Jan. 23, 2007

(54) METHOD OF GENERATING DEVELOPMENT ENVIRONMENT FOR DEVELOPING SYSTEM LSI AND MEDIUM WHICH STORES PROGRAM THEREFOR USING VLIW DESIGNATING DESCRIPTION

(75) Inventors: Nobu Matsumoto, Ebina (JP); Ryuichiro Ohyama, Tokyo (JP); Katsuya Uchida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 192 days.

(21) Appl. No.: 10/197,891

(22) Filed: Jul. 19, 2002

(65) Prior Publication Data
US 2003/0204819 A1    Oct. 30, 2003

(30) Foreign Application Priority Data
Apr. 26, 2002  (JP) ............................... 2002-127381

(51) Int. Cl.
*G06F 17/50* (2006.01)
(52) U.S. Cl. .................... 716/18; 716/2; 716/4; 703/14
(58) Field of Classification Search ................ 703/14; 716/1, 16–18, 2, 4; 712/217
See application file for complete search history.

(56) References Cited

U.S. PATENT DOCUMENTS 6,205,541 B1* 3/2001 Tran et al. .................. 712/217
6,477,683 B1* 11/2002 Killian et al. ................ 716/1
6,634,017 B2* 10/2003 Matsui et al. .............. 716/11
2006/0195828 A1   8/2006 Nishi et al.

FOREIGN PATENT DOCUMENTS

| JP | 2869379 | 12/1998 |
|---|---|---|
| JP | 2003-518280 | 6/2003 |
| KR | 2002-0021081 | 3/2002 |

OTHER PUBLICATIONS

Kazuyoshi Kohno, et al., "A New Verification Methodology for Complex Pipeline Behavior", Proceedings of the Design Automation Conference, Jun. 18-22, 2001, (6 pages).
Mitsuo Saito, "Progress of Semiconductor Technology and System on Chip", Trend, vol. 57, No. 1, Jan. 1, 2002, p. 38-42.
Hiroyuki Takano, et al., "A 4GOPS 3 Way-VLIW Image Recognition Processor Based on a Configurable Media Processor" IEICE Trans. Electron, vol. E85-C, No. 2, Feb. 2002, pp. 347-351.
U.S. Appl. No. 09/865,289, filed May 29, 2001.
U.S. Appl. No. 10/208,839, filed Aug. 1, 2002.

* cited by examiner

*Primary Examiner*—Thuan Do
(74) *Attorney, Agent, or Firm*—Oblon, Spivak, McClelland, Maier & Neustadt, P.C.

(57) ABSTRACT

A system LSI development environment generating method includes a compiler customizing section which generates a compiler from a configuration designation file, an assembler customizing section which generates an assembler, and a simulator generating section which generates a simulator. The configuration designation file contains a designation of hardware which executes instructions.

108 Claims, 25 Drawing Sheets

```
//configuration data
CHIP_NAME="SimpleChip1"; //Chip name
FREQUENCY=200;           //Frequency, Unit MHz //Processor 1
P_MODULE[Processor1]{
    P_ENGINE(
        //Specifications of processor core
        CORE{
            ID=0; // Core ID
            // Optional instruction
            DIV=ON;      // Division instruction
            MINMAX=ON;   //Maximum/minimum value instruction
            BIT=ON;      //Bit operation instruction
        };
        IMEM{
            SIZE=4;      //KB
        };
        DMEM{
            SIZE=2;      //KB
        BIU{ //Bus interface unit
            BUS_SIZE=64;
        };
        INTC{ //Interrupt controller
            CHANNEL_BITW=16; //Indefinite
            LEVEL=15; //Indefinite
        };
        DSU{ //Debug unit
            INST_ADDR_BREAK_CHANNEL=1;
            DATA_ADDR_BREAK_CHANNEL=1;
        };
    };
};
//Processor 2
P_MODULE[Processor2]{
    P_ENGINE(
        CORE{
            ID=1; // Core ID
            // Optional instruction
            DIV=ON;      //Division instruction
            MINMAX=OFF;  //Maximum/minimum value instruction
            BIT=OFF;     //Bit operation instruction
        };
        IMEM{ // Instruction RAM
            SIZE=8;      //KB
        };
        DMEM{ // Data RAM
            SIZE=20;     //KB
        };
        ICACHA{ // Instruction cache
            SIZE=4;      //KB
        };
        DCACHE{ // Data cache
            SIZE=8;      //KB
        };
    };
    //Core processor
    COPRO[Cop1]{
        IS_VLIW=YES ; //VUW-type coprocessor
        VLIW_BTW=32 ; //Instruction length 32 bits
        ISA_DEFINE="cop1.isa" ; //ISA definition, another file
        RTL    ="cop1.v"       //RTL description, another file
    };
    //User-defined module
    UCI{
        ISA_DEFINE="uci1.uci"; //ISA definition, another file
        RTL="uci1.v" ; //RTL description, another file
        SIM="ucimodel.c";   //Hardware c model, another file
    };
};
//Global map
GLOBAL_MAP="schip1.map"; //Designate another file
//end of file
```

```
//start : size : name : cache(opt) : shadow_original_start(opt) : scope : type : read_write(opt)
0X0000_0000 : 0X0020_0000 : RAM1 :                              ::global:memory : ro ;
0X0080_0000 : 0X0080_0000 : RAM2 : Cache                        ::global:memory : rw ;
0X8080_0000 : 0X0080_0000 : RAM3 :                              ::global:memory : rw ;
```

FIG. 4B

```
:RAM1       :0X00000000 : 0X00200000 :                  :global : ro::     memory:       In mm
:Imem0      :0X00200000 : 0X00002000 :                  : local : rw::     lmem:         In mm
:Imem1      :0X00202000 : 0X00002000 :                  : local : rw::     lmem:         In mm
:dmem0      :0X00208000 : 0X00004000 :                  : local : rw::     dmem:         In mm
:dmem1      :0X0020c000 : 0X00004000 :                  : local : rw::     dmem:         In mm
:Icahe_dat  :0X00300000 : 0X00004000 :                  : local : rw::     icache_data:
:Icahe_tag  :0X00310000 : 0X00004000 :                  : local : rw::     icache-tag:
:RAM2       :0X00800000 : 0X00800000 : cache            :global : rw::     memory:
:RAM3       :0X00808000 : 0X00800000 :                  :global : rw::     memory:
```

FIG. 4C

```
#Declare mnemonic, operation code, and argument of instruction
void xor(int_reg_modify,int_reg_src);
{
    code16="0000_0010_0000_0000";
}
short xon(int_reg_src,signed char_lmm);
{
    code16="0000_0011_iiii_iiii";
}
```

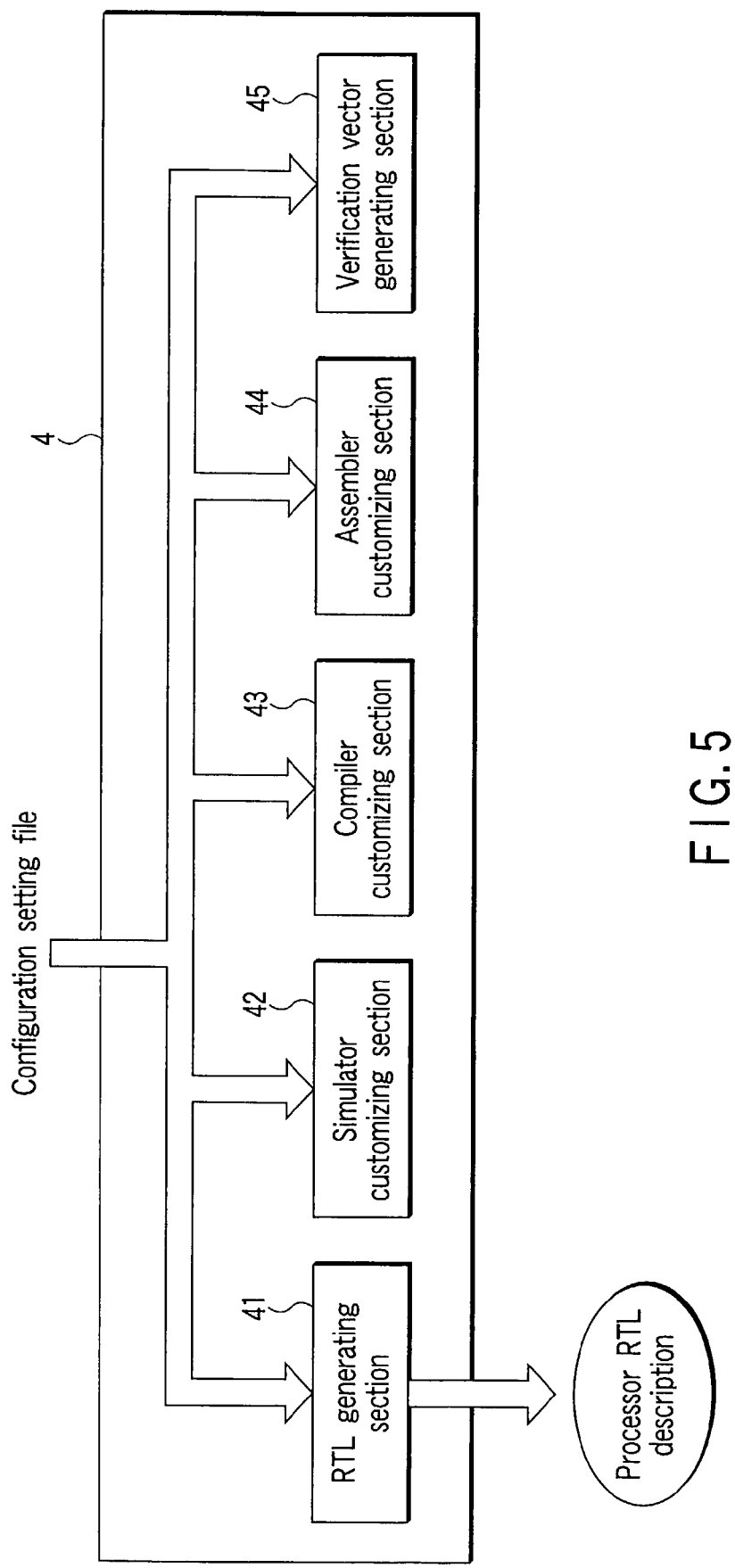
F I G. 5

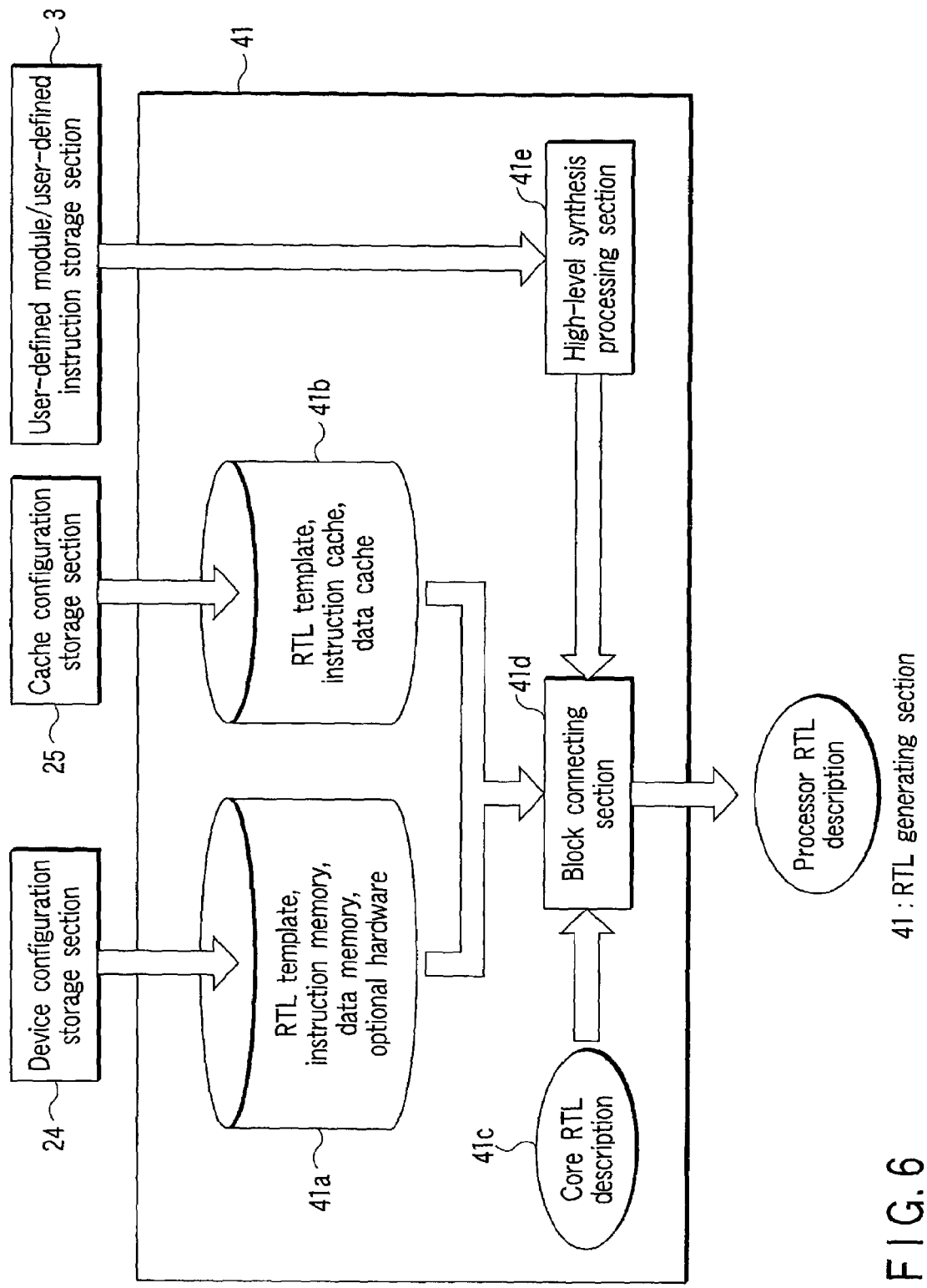
F I G. 6

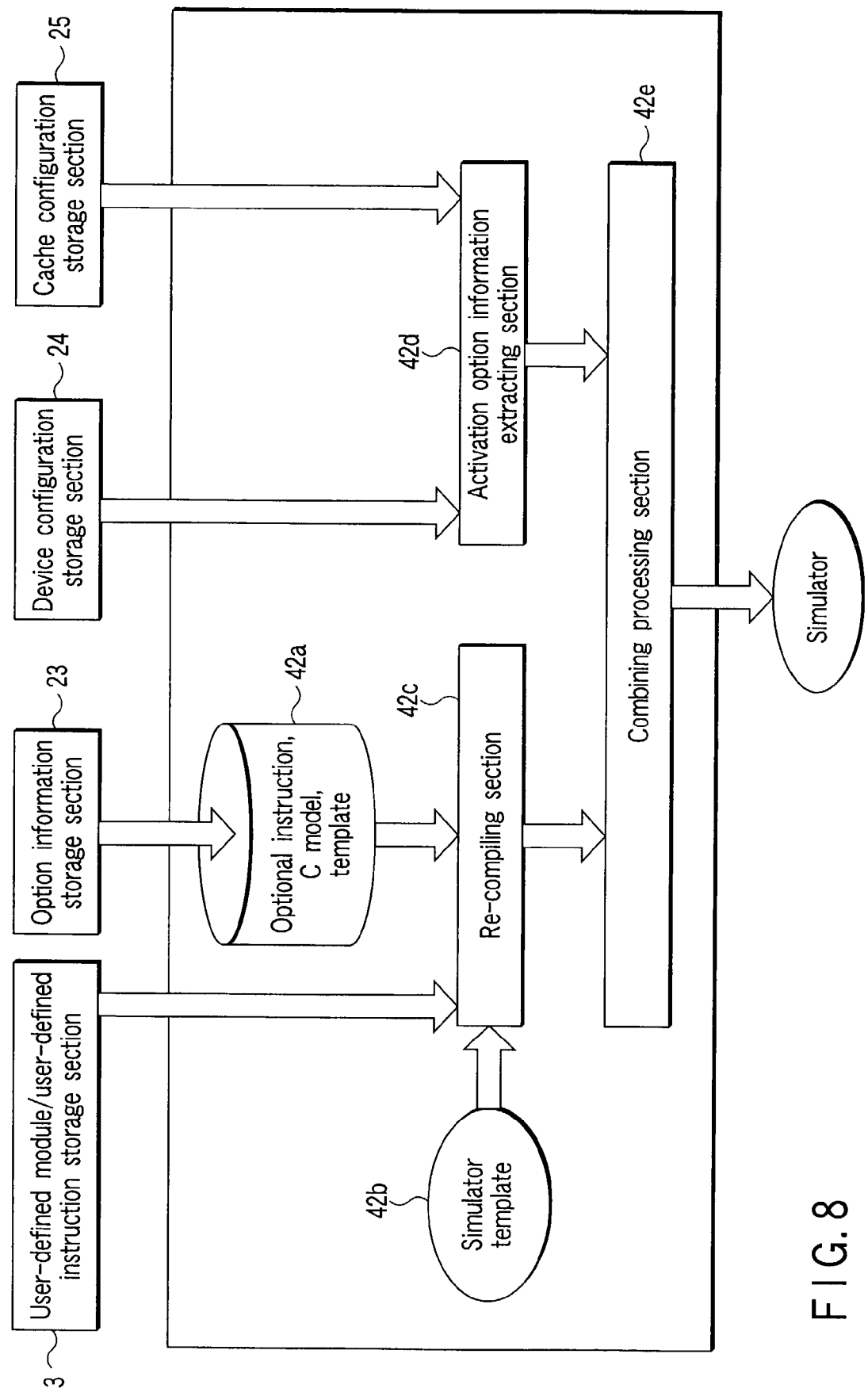
F I G. 8

```
-opt_minmax=ON
-opt_div=ON
-opt_bit=OFF
-rom=0x00000000,0x00200000
-imem=0x0020000,0x00300800
-dmem=0x00300000,0x00400000
-icache=0x00400000,0x007f0000
-dcache=0x007f0000,0x00800000
-ram=0x00800000,0x01000000
-ram-shadow=0x80800000,0x81000000
```

FIG. 9A

```
-rom=0x00000000,0x00200000
-imem=0x0020000,0x00300800
-dmem=0x00300000,0x00400000
-icache=0x00400000,0x007f0000
-dcache=0x007f0000,0x00800000
-ram=0x00800000,0x01000000
-ram-shadow=0x80800000,0x81000000
```

FIG. 9B

```
//Optional instruction
void_asm_min(int_reg_modify,int_reg_src);
void_asm_max(int_reg_modify,int_reg_src);
//User-defined instruction
void_asm_xor(int_reg_modify,int_reg_src);
short_asm_xori(int_reg_src,signed char_imm);
```

FIG. 9C

```
-opt_minmax=ON

-opt_div=ON

-opt_bit=OFF
```

FIG. 11A

```
XOR      Rn   Rm       {(Rn,32,U,1,1),(Rm,32,U,1,0)}
XOR1   Rn, Rm, Imm8    {(Rn,32,U,1,1),(Rm,32,U,1,0),(Imm8,U,1,0)}
```

\# XOR, Rn and Rm portions are formatted in assembler,
\# followed by definition of operand \# In (Rn,32,U,1,1), Rn indicates operand, 32 indicates number
\# of bits, U indicates presence/absence of sign (U is unsigned,
\# S is signed), 1 indicates that Rn is source operand, and last
\# 1 indicates that Rn is destination operand

FIG. 11B

```
//Designation of processor

Pro_NAME: Audio VLIW Processor;
Pro_TYPE: 2_WAY_VLIW;

//Register definition
<pro_register>
CR:    8: 32:
CCR: 0:  csar:"Audio Copro Shift-Amount Register" : {
        csar[5:0]:rw:X: "Shift Amount" :
};
//Instruction definition
<pro_ISA>
CAND: CRq, Crp:
        1111_0000_0111 0000_qqqq_pppp_0101:
        [ CRq=CRq and CRp ; ] :
        Cop: :
        C3:
        ;

//Operation description (HI!!L0)=Rn*Rm;
[msb:lsb]
```

FIG. 13

```
<register>
//The number of global purpose registers
GPR:16;
CR: 32: 64:
//Registers usage of compiler
RET: 0;        // The register for return value is 0
ARG: 1,2,3,4; // The register for parameters are 1,2,3,4
ZERO: 12;     // The register of which value is always 0 is 12
...
SP: 15;       // The register for stack pointer is 15
//Alias
alias sp R15;// sp is same as r15
//Definitions of control/special registers
CTR: 1: LP:"Link Pointer" : {
    LP[31:1]:rw: x"Return Address";
    LTOM[0]:rw:X:"LP Toggle Operation Mode";
};
...
```

F I G. 14

```
// 32bit*8
ACC: 2: 256;
```

F I G. 15

```
// Shift Amount Register
CSAR: 2;
```

F I G. 16

```
COP_NAME: Audio VLIW Coprocessor;
COP_TYPE: 2_WAY_VLIW;

//Register definition
<cop_register>
CR:    8: 32:
CCR: 0:   csar:"Audio Copro Shift-Amount Register" : {
        csar[5:0]:rw:X:"Shift Amount" ;
};
//Instruction definition
<cop_ISA>
CAND: CRq, Crp:
        1111_0000_0111 0000_qqqq_pppp_0101:
        [ CRq=CRq and CRp ; ]:
        Cop: :
        V3:
        chadd CRl,CRm,CRn:
        CRl,h=CRm. h+CRn. hi :
        Cop: :
        V1:
        ;
```

FIG. 17

```
DSP_NAME: TEST_DSP_MODULE

<dsp_register>
REG_WIDTH:20;
.
.
.
<dsp_ISA>
dmul: drq, drp:
      1111_0000_qqqq_pppp:
      { dhi = [39..20]drg*drp; dlo = [19..0]drg*drp; }:
      dsp::
.
.
.
```

FIG. 18

```
//SIMD instruction

CPADD.H: CRl, CRm, CRn:
      00111_11111_mmmmm_nnnnn:
      {
        CRl[15:0]  = CRm[15:0]  + CRn[15:0];
        CRl[31:16] = CRm[31:16] + CRn[31:16];
        CRl[47:32] = CRm[47:32] + CRn[47:32];
        CRl[63:48] = CRm[63:48] + CRn[63:48];
      }:
      Cop: "PACK=H,H,H"
      POs:
      ;
```

FIG. 19

```
//SIMD instruction
CPADD2. H: CRl, CRm, CRn:
        00111_11111_mmmmm_nnnnn:
        {
            CRl.h=CRm. h+CRn. h;
        }:
        Cop: "PACK=H,H,H"
        POs:
        ;
```

FIG. 20

```
//SIMD instruction
CPADD3. H: CRl, CRm, CRn:
        00111_11111_mmmmm_nnnnn:
        {
            CRl.hu=CRm. b+CRn. bu;
        }:
        Cop: "PACK=HU,B,BU"
        POs:
        ;
```

FIG. 21

```
//SIMD instruction
CPADD3. H: CRl, CRm, CRn:
        00111_11111_mmmmm_nnnnn:
        {
            CRl.[i]=CRm[3-i]+CR[3-i];
        }:
        Cop: "SIMD=B,PACK=H,H,H"
        POs:
        ;
```

FIG. 22

```
//SIMD instruction library

CPADD.xx   //2-operand 32bit Addition (A<-A+B)
CPADD3.xx  //3-operand 32bit Addition (A<-B+C)
CPADD1.xx  //2-operand 32bit Addition Immediate (A<-A+SignExt(Immediate))
CPADD13.xx //3-operand 32bit Addition Immediate (A<-A+SignExt(Immediate))

. . . .

CPSLL3.xx //3-operand Shift Left Logical Immediate (A<-B≪Immediate(Unsigned))

Xx                 Mnemonic
Unsigned Byte      UB
Signed Byte        B
Unsigned Halfword  UH
Signed Halfword    H
Unsigned Word      UW
Signed Word        W
```

F I G. 23

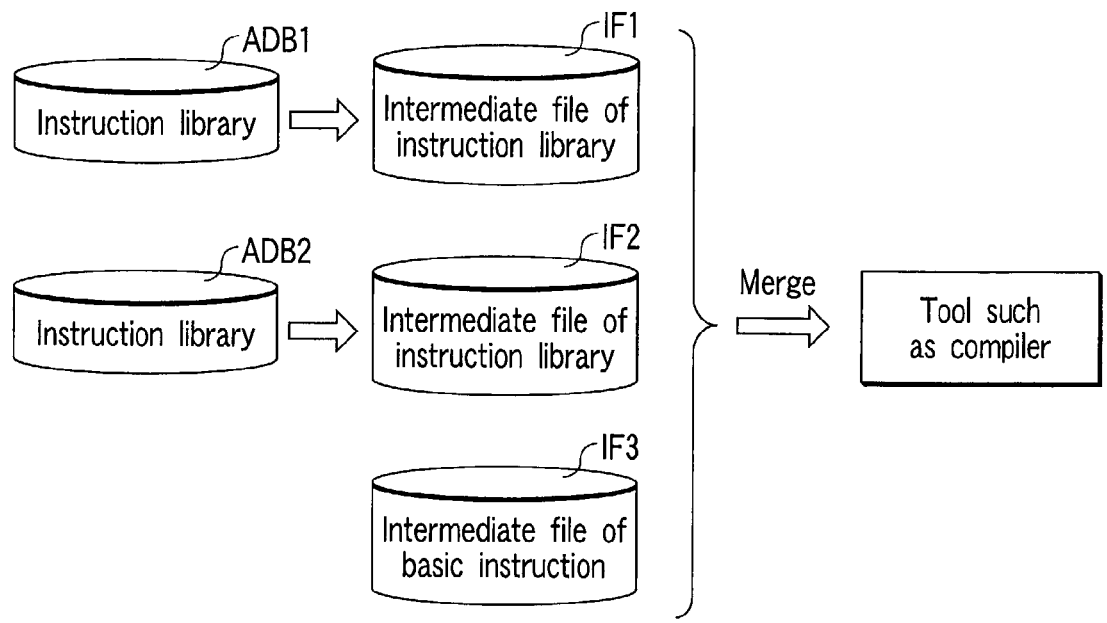
F I G. 24
```
LW:     Rn.disp8. align4(SP) :
        0100_nnnn_dddd_ddll :
        {Rn = MemWord(ZeroExtension(disp8[7..2] | | 0)+SP) ; }:
        Load:
        ;
SWAP:   (Rn), (Rm):
        1111_nnnn_mmmm_0010_0000_0000_0000_0001
        {tmp1 = MemWord(Rn[31..2] | | 00);
         tmp2 = MemWord(Rm[31..2] | | 00);
         MemWord(Rn[31..2] | | 00) = tmp2;
         MemWord(Rm[31..2] | | 00) = tmp1; }:
        Uci:
        ;
```
F I G. 25

PTYPE : pt1: cr, w, t, opd1: cr, r, opd2;
PTYPE : pt2: cr, r, t, opd1;

HAZARD:cr:Write(pt1), Read(pt2)=2;

InterlockPTYPE1:PTYPE2 3:PTYPE3 4;

```
//core pipe
   ...

//copro pipe
pipeline:cp0nop ={FCop () check () available (), Dcop (), T (), X0 (), S ()
pipeline:cp0move4={FCop (), Dcop (), T () check (CPR) available (GPR), S ()};
pipeline:cp0alu0={FCop (), Dcop (), T () check (CPR), X0 () available (CPR), S ()};
pipeline:cp0alu3={FCop (), Dcop (), T () check (CSAR,ACC),
                  X0 () available (CBCR), S ()};
pipeline:cp0mac3={FCop (), Dcop () check (CPR), T () check (ACC), X0 (),
                  X1 () available (ACC), S ()};

Stall : T–>D0;
Stall : D0–>FCop;
```

FIG. 30

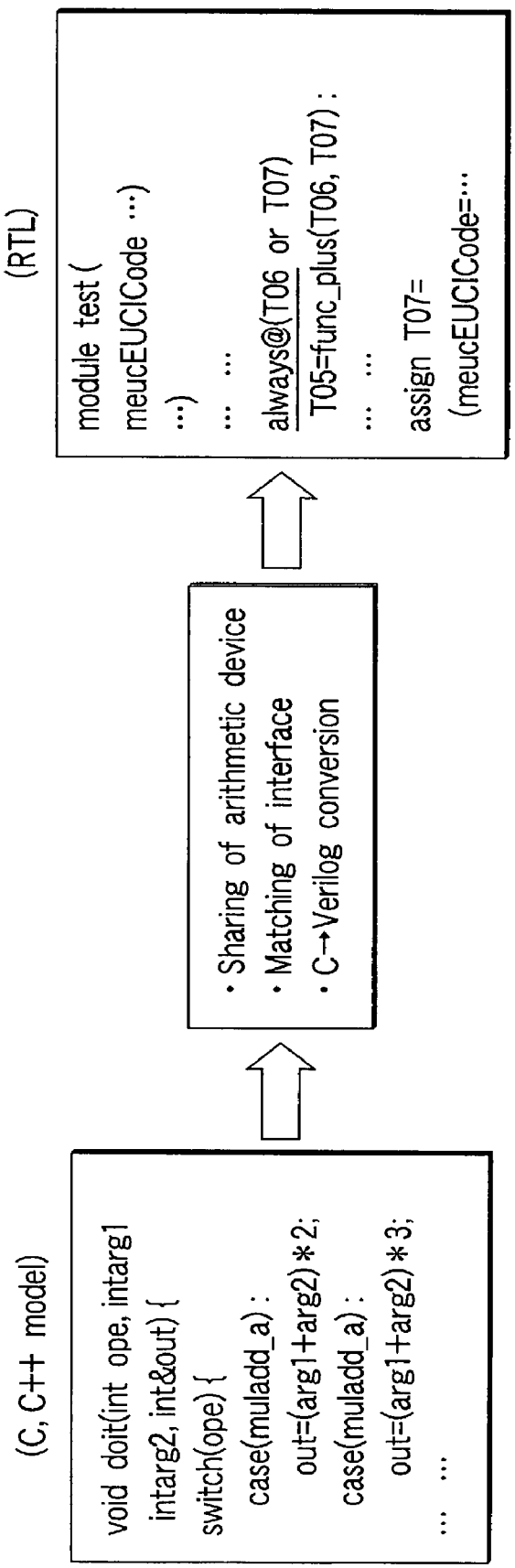
F I G. 31

```
//Instruction definition

CPXOR3: CRo, CRq, CRp:    //CRo <-cp(CRq, CRp)
        01011_qqqqq_ppppp_ooooo:
        {
            CRo = CRp xor CRq;
        }:
        Cop: :
        POs:
        ;
```

```
// ISA information

CPXOR3           // Mnemonic
CRo, CRq, CRp    // Operand list
POS              // Pipeline type
{
    (CRo_0, CPR, 32, DEST),    // Operand information
    (CRq_0, CPR, 32, SRC),     // Operand information
    (CRp_0, CPR, 32, SRC),     // Operand information
}
```

```
//Verification program of instruction CPXOR3
#mvac0:
    __PutMark
    movh    $1, %hi (0x0)              ¥
    add3    $1, $1, %lo (0x0)          |
    cmovh   $c22, $1                   | Initialize output register
    movh    $1, %hi (0x0)              | ($c22 : 64bit) by 0x0
    add3    $1, $1, %lo (0x0)          |
    cmov    $c22, $1                   /
    movh    $1, %hi (-487809850)       ¥
    add3    $1, $1, %lo (-487809850)   |
    cmovh   $c0, $1                    | Set inspection data in
    movh    $1, %hi (-942338075)       | input register ($c0 : 64bit)
    add3    $1, $1, %lo (-942338075)   |
    cmov    $c0, $1                    /
    movh    $1, %hi (-920359754)       ¥
    add3    $1, $1, %lo (-920359754)   |
    cmovh   $c15, $1                   | Set inspection data in
    movh    $1, %hi (472324452)        | input register ($C15 : 64bit)
    add3    $1, $1, %lo (472324452)    |
    cmov    $c15, $1                   /
    mov     $1, 0x0
    +CPXOR3 $c22, $c0, $c15            >Execute instruction to be inspected
    cmovh   $1, $c22                   ¥
    stcb    $1, LOGDISP                | Output arithmetic result
    cmov    $1, $c22                   | of instruction to log file
    stcb    $1, LOGDISP                /
    ...
```

FIG. 35

METHOD OF GENERATING DEVELOPMENT ENVIRONMENT FOR DEVELOPING SYSTEM LSI AND MEDIUM WHICH STORES PROGRAM THEREFOR USING VLIW DESIGNATING DESCRIPTION

CROSS-REFERENCE TO RELATED APPLICATIONS

This application is based upon and claims the benefit of priority from the prior Japanese Patent Application No. 2002-127381, filed Apr. 26, 2002, the entire contents of which are incorporated herein by reference.

BACKGROUND OF THE INVENTION

1. Field of the Invention

The present invention relates to a development environment used to design and develop a system LSI including, e.g., a configurable processor and, more particularly, to a method of generating a system LSI design/development environment and a medium which stores a program therefor.

2. Description of the Related Art

There has recently emerged a variety of needs for LSIs applied to, e.g., multimedia processing. In addition, the market cycle of LSIs is short. For this reason, a demand has arisen for a system LSI design/development environment to develop an LSI optimum for an application in a short time. A development environment means hardware necessary for forming a system LSI or software such as system development support tools.

Generally, when an LSI carries a general-purpose processor, the hardware design cost is almost zero. However, since an LSI having such an arrangement is not optimized for an application, it is difficult to fully exploit the performance of the application. Recently, configurable processors capable of selecting an instruction or memory configuration have been provided. A configurable processor provider provides a system which outputs a hardware description capable of designating a configuration and creating a structure representation. According to such a processor and system, a processor having an arrangement optimum for an application can be developed in a short time by designating an optional instruction or memory size.

Normally, when an instruction set or the like is changed, software development tools such as a compiler and simulator must also be changed. Hence, a system which generates a software development tool together with a hardware description by designating a configuration is also provided. According to such a system, the labor and time required for designing a software development tool can be greatly reduced.

Conventionally, a DSP (Digital Signal Processor) coprocessor configurable with respect to a RISC (Reduced Instruction Set Computer) has been developed. However, this DSP coprocessor can use only an ISA (Industry Standard Architecture) prepared in advance. No other architecture can be used. There is also a configurable processor capable of adding new instructions, though the configurable processor can add only instructions of fixed type. For this reason, it is difficult to cope with an architecture such as a VLIW (Very Long Instruction Word), and the flexibility is insufficient.

Additionally, to describe an additional instruction, an HDL (Hardware Description Language) such as Verilog is used. For this reason, an instruction cannot be efficiently added.

Furthermore, it is difficult to generate a necessary development environment from an instruction defined by a user. Hence, there is a demand for a system LSI development environment generation method capable of easily and flexibly generating a development environment of an LSI having high-performance hardware, and a medium which stores a program therefor.

BRIEF SUMMARY OF THE INVENTION

According to an aspect of the invention, there is provided a method of generating a development environment for developing a system LSI, comprising: analyzing an input command; and in accordance with the analyzed command, generating a compiler customizing section, assembler customizing section, and simulator generating section on the basis of information from a configuration designation file in which a configuration of a system LSI is described, wherein the configuration designation file contains designation of hardware which executes an instruction, the compiler customizing section generates a compiler to develop the system LSI, the assembler customizing section generates an assembler, and the simulator generating section generates a simulator.

According to another aspect of the invention, there is provided a computer readable medium with a program which generates a development environment for developing a system LSI, comprising: causing a computer to analyze an input command; and causing a computer to, in accordance with the analyzed command, generate a compiler customizing section, assembler customizing section, and simulator generating section on the basis of information of a configuration designation file in which a configuration of a system LSI is described, wherein the configuration designation file contains designation of hardware which executes an instruction, the compiler customizing section generates a compiler to develop the system LSI, the assembler customizing section generates an assembler, and the simulator generating section generates a simulator.

BRIEF DESCRIPTION OF THE SEVERAL VIEWS OF THE DRAWING

FIG. 3 is a view showing a description example of a configuration designation file;

FIG. 4A is a view showing a description example of a memory area common to all processors;

FIG. 4B is a view showing a generated local memory map;

FIG. 4C is a view showing a description example of an ISA define file;

FIG. 5 is a block diagram showing the arrangement of a system LSI development environment generating section;

FIG. 6 is a block diagram showing an example of an RTL generating section shown in FIG. 5;

FIG. 8 is a block diagram showing a simulator customizing section shown in FIG. 5;

FIG. 9A is a view showing a simulator activation option file;

FIG. 9B is a view showing a debugger activation option file;

FIG. 9C is a view showing a machine instruction function declaration header file;

FIG. 11A is a view showing a complier activation option file;

FIG. 11B is a view showing a user-defined instruction file for verification vector generation;

FIG. 13 is a view showing a configuration designation file;

FIG. 14 is a view showing a description example of a register defining section shown in FIG. 13 in detail;

FIG. 15 is a view showing definition of an accumulator;

FIG. 16 is a view showing definition of a shift amount register;

FIG. 17 is a view showing coprocessor definition;

FIG. 18 is a view showing a DSP module configuration designation file;

FIG. 19 is a view showing definition of a SIMD instruction;

FIG. 20 is a view showing a description example of one line;

FIG. 21 is a view showing a description example of one line;

FIG. 22 is a view showing a description example using an index;

FIG. 23 is a view showing a SIMD instruction library;

FIG. 24 is a view showing a method of generating a tool such as a complier from instruction libraries;

FIG. 25 is a view showing an instruction set defining section in the configuration designation file;

FIG. 30 is a view showing a pipeline operation description;

FIG. 31 is a view showing high-level synthesis of a user-defined module by the RTL generating section;

FIG. 35 is a view showing a verification program of the instruction CPXOR3;

DETAILED DESCRIPTION OF THE INVENTION

An embodiment of the present invention will be described below with reference to the accompanying drawing.

A system LSI developing apparatus applied to this embodiment will be briefly described with reference to FIGS. 1 to 10.

(Arrangement of System LSI Developing Apparatus)

Figure 1:
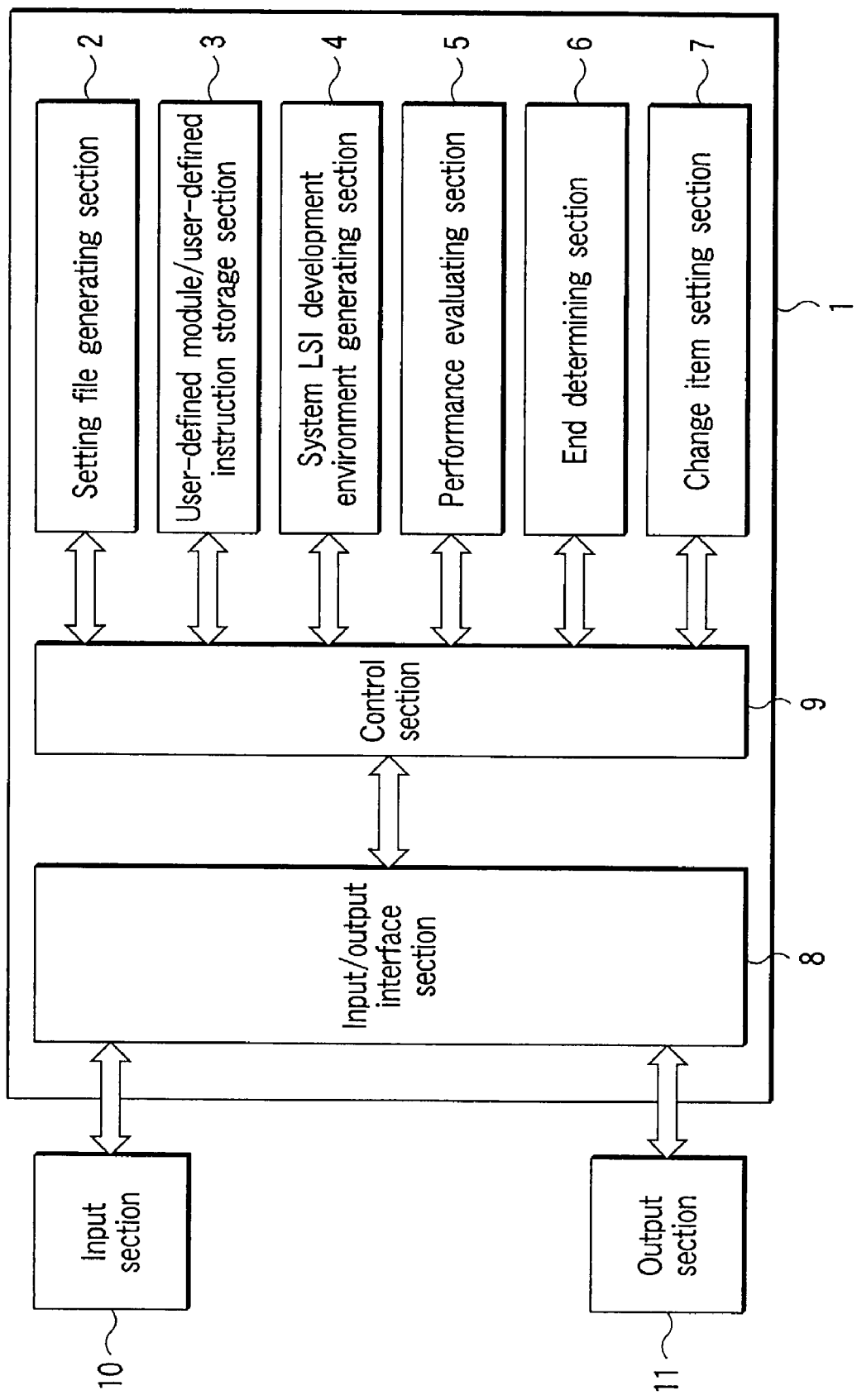
FIG. 1 is a block diagram schematically showing a system LSI developing apparatus to which the present invention is applied.

FIG. 1 shows a system LSI developing apparatus 1. The system LSI developing apparatus 1 has a setting file generating section 2, user-defined module/user-defined instruction storage section 3, system LSI development environment generating section 4, performance evaluating section 5, end determining section 6, change item setting section 7, input/output interface section 8, and control section 9.

An input section 10 which inputs various kinds of information into the apparatus 1 and an output section 11 which outputs various kinds of information from the apparatus 1 are connected to the system LSI developing apparatus 1. As the input section 10, for example, a keyboard, mouse, numeral keypad, touch panel, or the like can be used. As the output section 11, for example, a display apparatus, printing apparatus, or the like is applied.

FIGS. 2 to 13 show the arrangements of sections in the system LSI developing apparatus 1.

(Arrangement of Setting File Generating Section)

Figure 2:
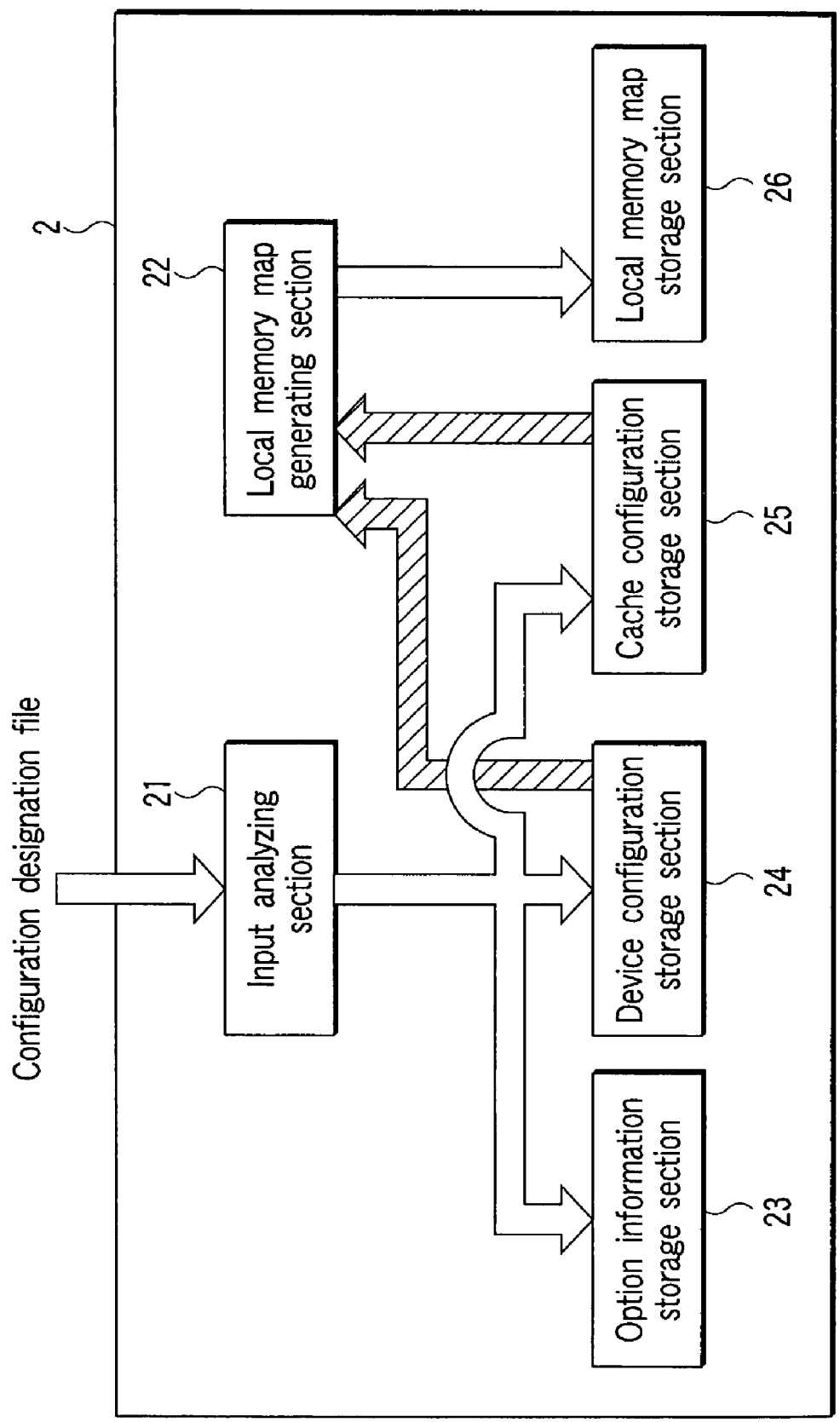
FIG. 2 is a block diagram showing a setting file generating section.

FIG. 2 shows the arrangement of the setting file generating section 2. The setting file generating section 2 has an input analyzing section 21, local memory map generating section 22, option information storage section 23, device configuration storage section 24, cache configuration storage section 25, and local memory map storage section 26. The setting file generating section 2 generates and stores a configuration for system LSI design on the basis of a configuration designation file (to also be referred to as an architecture database file hereinafter) that describes a configuration for system LSI design, variable value setting information, highest priority item setting information, target performance designation information, and change item list information supplied from the change item setting section 7. The target performance designation information contains one or both of hardware performance and software performance. Performance indices of hardware include an area, frequency, and power consumption. Performance indices of software include code size, number of effective instructions, and number of execution cycles.

The input analyzing section 21 analyzes the contents of a configuration designation file and divides the contents of a configuration described in the configuration designation file to the option information storage section 23, device configuration storage section 24, and cache configuration storage section 25.

Pieces of information are described in the configuration designation file, including the presence/absence of optional instructions, the presence/absence of devices, the presence/absence of a cache, cache size, user-defined instructions, user-defined hardware modules, memory map in the LSI, and multiprocessor configuration (e.g., the number of multiprocessors). At the description portion of a user-defined instruction or user-defined hardware module, the storage location of the file name that describes the user-defined instruction or user-defined module (in this embodiment, the position of the user-defined module/user-defined instruction storage section 3) is designated by describing an absolute path or relative path.

For the presence/absence of devices, devices include an instruction memory, data memory, and coprocessor. Variable items of the instruction memory and data memory include a size and address. A memory map includes an external memory area, internal memory area, and input/output area.

The external memory area also includes the designation item of a cache access area. Each memory area also includes latency information.

In designating a configuration for system LSI design from the configuration designation file, the user selects one of variable values defined by the storage sections 23 to 26 in the setting file generating section 2. The selected value is described in the configuration designation file as shown in FIG. 3.

For example, in the following SIZE description, as the size of an internal data memory, for example, one of 1, 2, 4, 8, 16, and 32 [KB] can be selected. If this SIZE description is omitted, the size has the default value (8 [KB]).

DMEM:
  SIZE Ptype={1, 2, 4, 8, 16, 32}, default=8, comment="size of internal data memory"

In the following ISA_DEFINE description, an arbitrary character string must be described as the ISA define file name of a user-defined instruction.

UCI:
  ISA_DEFINE Ptype=string, default="", comment="ISA define file name of user-defined instruction";

The configuration setting operation may be done by interactive processing through the input/output interface section 8. When the configuration is interactively set, the user can easily set the configuration without being conscious of the syntax of the configuration designation file. For this reason, the time required for configuration setting can be shortened as compared to a case wherein a configuration is directly described in a file. In addition, all configurations can be interactively set. Hence, any mistake, e.g., forgetting setting one configuration can be prevented.

A variable value may set in a configuration. When a variable value is set in a configuration, the setting file generating section 2 automatically derives other set values of the configuration using basic settings, a template made to measure variable values, or values set by the user. When a variable value is set in a configuration, the user can simultaneously obtain a plurality of development environments and verification environments corresponding to the variable range of the configuration. For this reason, the LSI development cycle can be shortened.

A highest priority item in configurations may be set. When a highest priority item is set in configurations, the setting file generating section 2 generates, for set values other than the highest priority item, configurations in which the highest priority item is optimum. To generate the configuration, basic settings, a template based on the highest priority item, or set values designated by the user are used. When a highest priority item is set in a configuration, the user can generate a development environment and verification environment suitable for the priority item and evaluate the environment without recognizing the configuration of a system LSI.

(Arrangement of Local Memory Map)

The local memory map generating section 22 integrates a global map designated from a configuration designation file with pieces of local memory information of individual processors in a system LSI, thereby generating a local memory map for each processor in the system LSI. The global map corresponds to a memory region common to all processors, as shown in FIG. 4A. Each local memory information contains, e.g., an instruction memory, data memory, instruction cache, and data cache. FIG. 4B shows a local memory map. The generated local memory map is stored in the local memory map storage section 26.

The local memory area of each processor can be generated by reflecting a memory size designated by the configuration designation file on a memory area in the global map, which is reserved for the local memory. When shadow memory information of each processor is designated in the global memory in advance, a shadow memory including the local memories of the remaining processors can be generated in the local memory of each processor.

The option information storage section 23 stores information related to the ON/OFF type of each optional instruction in the instruction set of each processor incorporated in the system LSI, on the basis of the configuration designation file analysis result by the input analyzing section 21.

The device configuration storage section 24 stores information related to the ON/OFF type of each device incorporated in the system LSI and information related to the device's size, address information, information related to the instruction memory or data memory of each processor, and information related to optical hardware such as a coprocessor, on the basis of the configuration designation file analysis result by the input analyzing section 21.

(Arrangement of Cache Configuration Storage Section)

The cache configuration storage section 25 stores information related to the ON/OFF type of the cache of the system LSI, information related to the type (direct, 2-way, 4-way, or n-way) of the cache, and information related to the size, on the basis of the configuration designation file analysis result by the input analyzing section 21.

(Arrangement of Local Memory Map Storage Section)

The local memory map storage section 26 stores information related to the local memory map generated by the local memory map generating section 22.

(Arrangement of User-Defined Module/User-Defined Instruction Storage Section)

The user-defined module/user-defined instruction storage section 3 stores pieces of information related to user-defined hardware modules and user-defined instructions in an instruction set of each processor incorporated in the system LSI. Information related to a user-defined hardware module is preferably described by RTL (Register Transfer Level) description or operation description, and information related to the operation of an instruction is preferably described by C model (including C++ model) and stored in the storage section 3. The operation description and C model may be identical. In addition, information related to a user-defined instruction is preferably described in an architecture DB file as shown in FIG. 13, for example, which is designated from the configuration designation file, and stored.

(Arrangement of System LSI Development Environment Generating Section)

As shown in FIG. 5, the system LSI development environment generating section 4 has an RTL generating section 41, simulator customizing section 42, compiler customizing section 43, assembler customizing section 44, and verification vector generating section 45. The system LSI development environment generating section 4 generates the hardware, verification environment, and development/design tool of a system LSI for all combinations of configurations stored in the setting file generating section 2.

The internal arrangement of the system LSI development environment generating section will be described below in detail.

(Arrangement of RTL Generating Section)

The RTL generating section 41 generates the RTL description of a processor incorporated in the system LSI on the basis of a configuration stored in the storage section of the setting file generating section 2.

FIG. 6 shows an example of the RTL generating section 41. A block connecting section 41*d* refers to configurations stored in the device configuration storage section 24 and cache configuration storage section 25 and selects, from RTL templates 41*a* and 41*b*, templates corresponding to the configurations set by the user. A high-level synthesis processing section 41*e* high-level synthesizes operation descriptions as the specifications of user-defined instructions or user-defined hardware modules stored in the end determining section 6, thereby generating an RTL description. The connecting section 41*d* also connects the selected RTL template and the RTL description from the high-level synthesis processing section 41*e* to an RTL description 41*c* of the processor core section, thereby generating the RTL description of the processor. When the specification in the storage section 3 is RTL description, it is connected such that interface signals match.

When a multiprocessor configuration is defined, the block connecting section 41*d* generates a plurality of processor descriptions and generates an RTL description of a multi-processor connected by a bus.

For the instruction memory, data memory, optional hardware, instruction cache, and data cache contained in the RTL templates 41*a* and 41*b*, an RTL description is prepared in advance for each of memory sizes selectable by the user. These RTL descriptions can be selectively connected in accordance with designated configurations. For optional instructions, templates of hardware corresponding to the optional instructions are prepared for all ON/OFF combinations of optional instructions.

Figure 7:
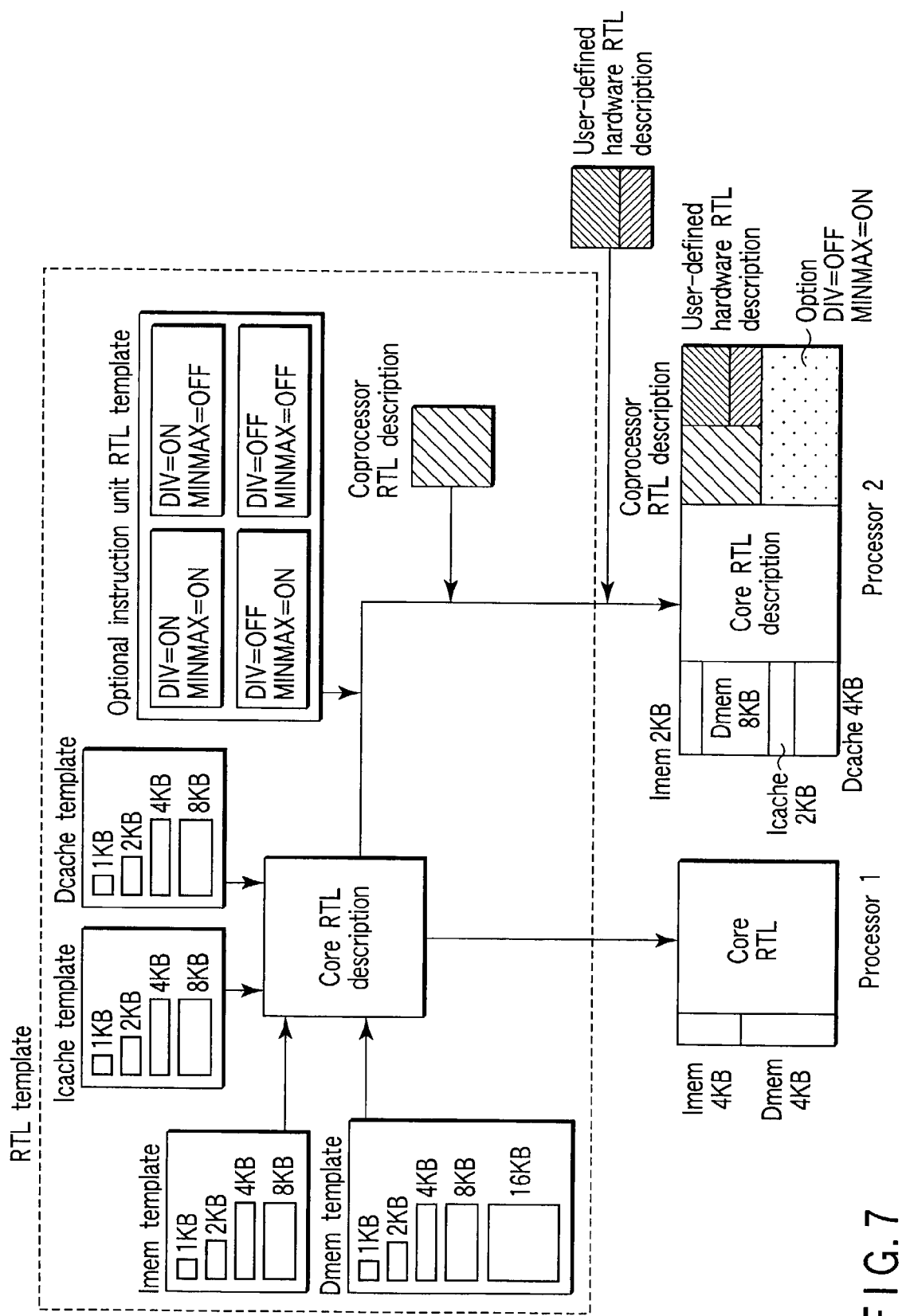
FIG. 7 is a view showing an RTL template.

FIG. 7 shows an RTL template. Referring to FIG. 7, as an optional instruction unit RTL template, an RTL description is prepared as a template for each of four ON/OFF combinations of a division optional instruction (DIV) and ON/OFF of a maximum/minimum value optional instruction. These templates are selectively connected to the core RTL description in accordance with the configurations stored in the device configuration storage section 24 and cache configuration storage section 25. Even for optional hardware such as a coprocessor, if it is designated as valid by a configuration, an already defined RTL description is connected to the core RTL description. When user-defined hardware is present, a hardware description described by the user is connected to the core RTL description.

With the above connection processing, the RTL generating section 41 generates the RTL description of a processor corresponding to a set configuration. For example, when processor 1 is to be generated first, the user can automatically obtain the RTL description of processor 1 by adding a 4-[KB] instruction memory and 4-[KB] data memory to the processor core as configuration parameter designations.

To generate processor 2, the user adds, e.g., a 2-[KB] instruction memory, 8-[KB] data memory, 2-[KB] instruction cache, and 4-[KB] data cache to the processor core as configuration parameter designations. In addition, RTL descriptions of a coprocessor, several optional instructions, and user-defined instructions are added, thereby obtaining the RTL description of processor 2.

Instead of preparing a plurality of RTL templates, a RTL description can also be obtained by reflecting a value set in a configuration on an RTL template in which a variable item is expressed as a parameter. Such an RTL template using a parameter may be arranged for each partial module such as a memory or cache. Alternatively, RTL templates for an entire processor, including partial modules such as memories and caches, may be prepared. One RTL template containing all parameters may be used.

(Arrangement of Simulator Customizing Section)

FIG. 8 shows the simulator customizing section 42. The simulator customizing section 42 generates a simulator which executes instruction operations according to a configuration.

Referring to FIG. 8, a re-compiling section 42*c* combines the C model of user-defined hardware stored in the user-defined module/user-defined instruction storage section 3 into a simulator template 42*a* and re-compiles, thereby regenerating a C or C++ simulator. An activation option information extracting section 42*d* refers to data stored in the device configuration storage section 24 and cache configuration storage section 25 in the setting file generating section and generates a simulator activation option file (FIG. 9A) for designating an option in activation.

A combining processing section 42*e* combines the regenerated simulator supplied from the re-compiling section 42*c* with the simulator activation option file supplied from the activation option information extracting section 42*d*, thereby generating a simulator which executes instruction operations according to a configuration.

A simulator preferably has a means for outputting an execution result of a debug command when a specific address is passed. Conventionally, an assertion error program which outputs an error when an error has occurred halfway during execution is used. However, to check the progress when a device is normally executing, an instruction for outputting an intermediate result must be embedded in an application. Alternatively, execution must be stopped by a debugger or the like to read the progress. However, when predetermined information is output when an address designated at the time of activation has been passed, the progress can be checked while a simulator is executing an application. For example, a simulator is activated by the following command.

sim -load test.hex -printx mem(0x400) at 0x1200

In this case, sim means a simulator of a system LSI, -load test. hex is an instruction for loading a hexadecimal file named test.hex, -printx mem(0x400) at 0x1200 is an instruction for outputting the contents at address 0x400 in a memory when address 0x1200 has been passed.

That is, the simulator stores the instruction designated by this argument and outputs the contents at address 0x400 to the console as a hexadecimal number every time the program counter passes address 0x1200. At this time, the application has no code for observation. For this reason, the simulation can observe execution of the application program without influencing statistical information such as the number of instructions or the number of cycles. In addition, it is unnecessary to stop execution at a specific address and to manually read out and display a value in a memory. For this reason, the application program can be simulated while accurately collecting statistical information and confirming an especially notable intermediate result. For this reason, an LSI can be efficiently developed.

When memory access to an undesignated area occurs, the simulator preferably stops execution. When the simulator is activated in accordance with the set configurations, a usable memory is definitely given. If access to an unmounted memory area on the substrate occurs, for example, a bus error occurs, and subsequent operation is not guaranteed. A program whose operation is not guaranteed must be corrected at early stages by pointing out the error at the time of execution of the simulator. Hence, the simulator designates a memory area that exists and inhibits access to any area that is not explicitly designated. If the access-inhibited area is accessed, the simulator issues a warning and stops operation of the program. The simulator has an interactive mode (debug mode). When the interactive mode is set, the simulator can analyze the position of the error. More specifically, when the simulator is communicating with the debugger and operating, the simulator interrupts simulation operation and waits for a debugger command. Then, the simulator displays an access error to an invalid area, thereby reliably notifying the user of the error in the program at early stages.

For a decoding circuit of a memory, connection of upper address signal lines is sometimes omitted. In this case, no bus error occurs even when a program is executed at an erroneous address in the target. However, in write access, contents at an undesired address may be rewritten, and an unexpected execution result may be obtained. When this erroneous program is executed by an RTL simulator, the error cannot be immediately detected. However, when the program is executed after accurate mapping information is given to the simulator such that it can access only a correct address, the user can be immediately warned about access to an address outside the designated range. Hence, the user can detect the erroneous program at early stages and need not waste the analyzing time. For this reason, the development cycle can be shortened.

The debugger refers to data stored in the device configuration storage section 24 and cache configuration storage section 25 and generates a debugger activation option file as shown in FIG. 9B. When the debugger activation option file is used, the debugger can execute operation according to the configurations.

The debugger preferably has a means for reading out the statistical information of the simulator as a virtual register or a variable. The debugger reserves a special variable "$profile". Statistical information is managed for each area. This statistical information is displayed by a variable read command "print" of the debugger. For example, to display the third information in an area, "print$profile[3]" is input.

dbg> print$profile[3]
   profile3:Count:7 Inst=123 Cycle=145
   dbg>

A language tool preferably has a means for outputting a debug command for a simulator as debug information similar to a symbol or source line together with an address (the command is not reflected on the machine instruction of the target). The compiler is extended to output an intermediate output to a standard output by a simulator or the like. A statement following "#pragmacosoleout" is not translated into the machine language of the target. The statement is stored in a file as debug information, like a symbol name or line number. When an object file with debug information is loaded, the simulator stores address information in which a "#pragma" statement is defined and also stores "printf ("a=%d¥n",a)" as debug output information. When the simulator is going to execute the address, the simulator determines that debug information must be output, sends the printf statement to the parser, and outputs the debug information.

In this way, the debug information can be output in executing the simulator without influencing the machine instruction of the target, and confirm the contents without interrupting execution of the simulator. The statistical information collected in executing the simulator is the same as that executed by the target. In other words, identical object codes are used by the target and simulator. Since no time for re-compiling due to the difference in execution environment is required, the development cycle can be shortened. In addition, since a single object file can be shared, management is easy.

```
func(int b) {
    float a;
    for (I=1;I<20;i++) {
        A=b/I;
        #pragma consoleout printf("a=%d¥n",a);
    }
```

(Arrangement of Compiler Customizing Section)

The compiler customizing section 43 refers to data stored in the option information storage section 23 and user-defined module/user-defined instruction storage section 3 and generates a machine instruction function declaration header file, including a machine instruction function declaration, as shown in FIG. 9C. A machine instruction function declaration describes an instruction unique to a processor as a function declaration of a high-level language to designate the instruction unique to the processor directly from the high-level language.

Figure 10:
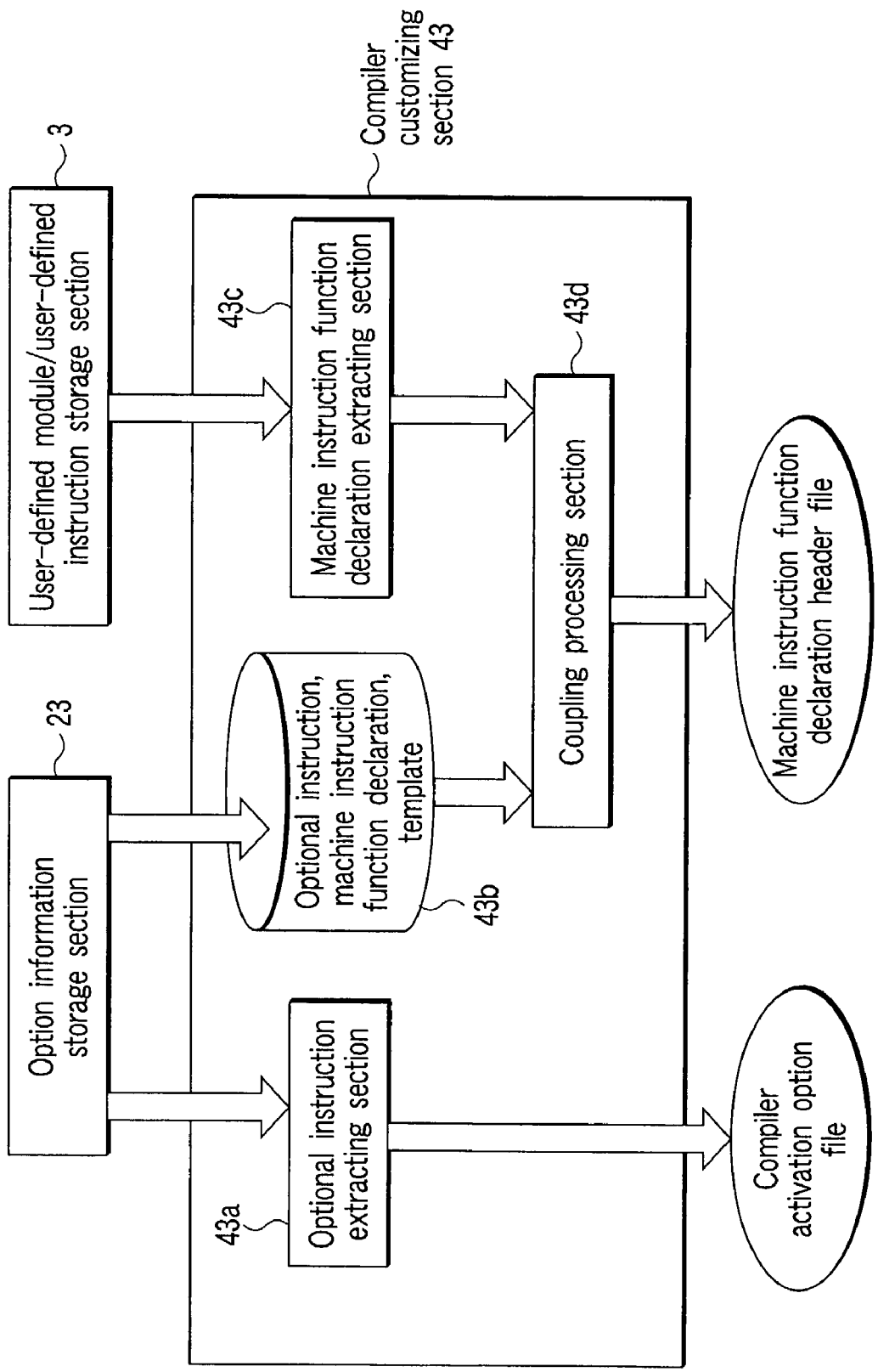
FIG. 10 is a block diagram showing an example of a compiler customizing section 43 shown in FIG. 5.

FIG. 10 shows an example of the compiler customizing section 43. Referring to FIG. 10, a machine instruction function declaration extracting section 43c refers to a user-defined instruction stored in the user-defined module/user-defined instruction storage section 3 and extracts a corresponding machine instruction function declaration. A coupling processing section 43d refers to data stored in the option information storage section 23 and selects a machine instruction function declaration corresponding to a valid optional instruction from a template 43b already defined. The coupling processing section 43d also couples the machine instruction function declarations supplied from the template 43b and machine instruction function declaration extracting section 43c to generate a machine instruction function declaration header file. This machine instruction function declaration header file contains an optional instruction validated by a configuration and a machine instruction function declaration corresponding to a user-defined instruction.

With this processing, the user can designate the optional instruction and user-defined instruction designated by the configuration directly from a high-level language program and use them.

The compiler customizing section 43 also has an optional instruction extracting section 43a. The optional instruction extracting section 43a refers to data stored in the option information storage section 23 and acquires information of an optional instruction usable for optimization. In accordance with the information of the optional instruction, the compiler customizing section 43 generates a complier activation option file (FIG. 11A) for designating an option in activating the compiler.

With this processing, the information of a usable optional instruction can be reflected on optimization of the compiler. In addition, since the function library of the compiler is re-compiled from the source using the activation option file, a library containing a usable optional instruction can be generated.

(Arrangement of Assembler Customizing Section)

The assembler customizing section 44 combines a usable optional instruction and the information of the mnemonic and instruction form of a user-defined instruction to regenerate an assembler. According to the assembler customizing section 44, a corresponding object code can be generated for an assembler program formed from a combination of all usable instructions.

(Arrangement of Verification Vector Generating Section)

The verification vector generating section 45 refers to configurations designated in the respective storage sections in the setting file generating section 2 and generates a verification vector used to verify the arrangement of the designated system LSI. When the scale of the system LSI is large, portions that are changed from the basic arrangement must be selectively verified in order to end verification within a limited time. To selectively verify a designated optional instruction, a cache of a designated size, or the like, the verification vector preferably generates a verification vector group corresponding to the respective instructions on the basis of an instruction set description (FIG. 11B shows a user-defined instruction file for verification vector generation).

This embodiment will be described next in more detail.

In the environment of this embodiment, an RTL, compiler, assembler, simulator, verification vector, and debugger are automatically generated from a configuration designation file (architecture DB file) in which instruction operation of a processor is described. The configuration designation file contains a description for designating one of a plurality of defined architectures (designation of an architecture type). Examples of architecture types are to be executed in an VLIW mode (to be executed in a specific pipe (VLIW slot)) and DSP instruction. On the basis of the designation of the architecture type, instruction scheduling of the compiler and parallelizing function of VLIW are controlled. In addition, the performance estimated value in the instruction set simulator is adjusted. When this environment is used, the user can uniquely define an instruction in accordance with an application. The instruction defined by the user is called a user-defined instruction. In addition, a program can be generated by a high-level language, and the performance of the program can be evaluated using a simulator.

As a basic component, the environment of a machine instruction function is automatically generated for the user-defined instruction. When the machine instruction function is used, the functions of the compiler, e.g., instruction scheduling, parallel VLIW (instruction packing), and register assignment can be used.

Each embodiment will be described below in detail.

(First Embodiment)

Figure 12:
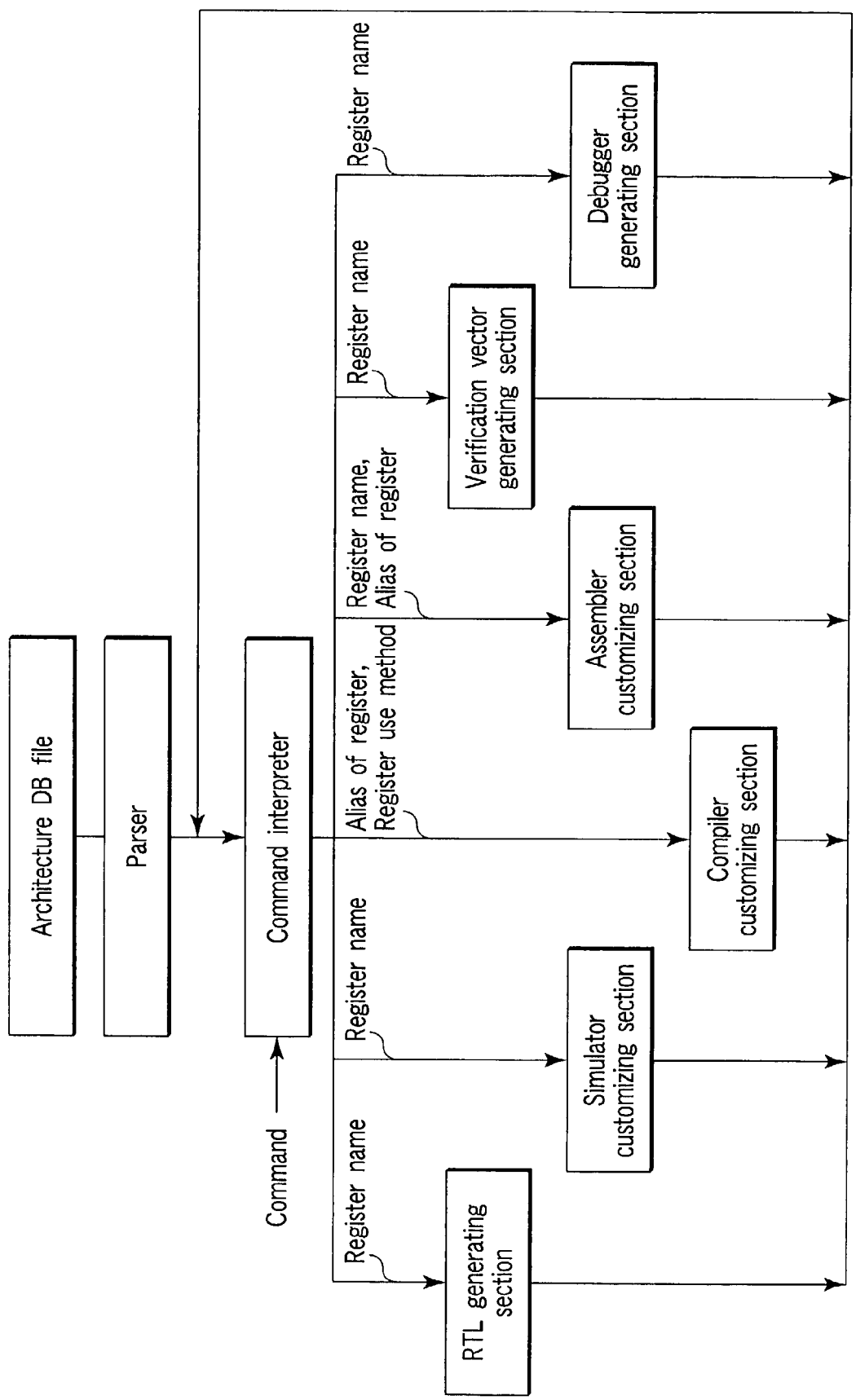
FIG. 12 is a view showing the program arrangement of the system LSI development environment generating section of the present invention.

FIG. 12 shows the first embodiment of the present invention. FIG. 12 schematically shows the example for adding an instruction of a system LSI development environment generating section 4 shown in FIG. 1. The arrangement is almost the same as that shown in FIG. 5.

A configuration designation file as an architecture DB file supplied from a setting file generating section 2 is supplied to a parser. The parser analyzes the configuration designation file. The command interpreter analyzes a command designated by the user and, in accordance with the analyzed contents of the command, controls the execution order of, e.g., the RTL generating section, simulator generating section, compiler customizing section, assembler customizing section, verification vector generating section, and debugger generating section. As an execution scheme, a series of processing operations are registered in advance. Batch processing of continuously executing these processing operations or interactive processing can be selected. The command designated by the user is input using, e.g., a GUI (Graphical User Interface) or CUI (Character base User Interface). The parser may be activated by command interpreter.

FIG. 13 shows a configuration designation file as an architecture DB file. In the configuration designation file, for example, designation of a processor, register definition, and instruction definition can be described. To designate a processor, for example, the name and type of a processor can be described. Referring to FIG. 13, for a processor, type (2_WAY_VLIW) is described as an architecture type. That is, 2-WAY VLIW is selected for two architectures defined in advance.

An instruction definition is formed from the mnemonic, bit pattern, and operation description of an instruction. The bit pattern contains bit information or an operation code and operand.

In the operation description, in addition to the operation description of a normal program, bit division, bit coupling, sign/zero extension, and overflow operation can be described. In addition, a temporary variable necessary for realizing SWAP operation or the like can be used.

FIG. 13 shows only part of the configuration designation file.

According to the first embodiment, the command interpreter controls the execution order of the RTL generating section, simulator generating section, compiler customizing section, assembler customizing section, verification vector generating section, and debugger generating section in accordance with the analyzed contents of a command. For this reason, the user can arbitrarily set the development environment generation order. Hence, a development environment can be arbitrarily generated in accordance with the development order of an application.

(Second Embodiment)

The second embodiment is related to a register defining section.

FIG. 14 shows a description example of the register defining section shown in FIG. 13 in detail. In the register defining section, the number of general-purpose registers, the register use method of the compiler (a function return value register, an argument register, a register which is handed over to a function called by a function call, a register which is not handed over to a function called by a function call, a stack pointer register, a global pointer register, a tiny pointer register, a 0 register, the like), alias definition of each general-purpose register, and definition of a control register are designated. The register use method can be omitted. If it is omitted, a compiler to which a default method is applied is generated.

Referring to FIG. 14, a number GPR of general-purpose registers is 16. As a manner the compiler uses registers, a function return value register RET is register 0, function argument registers ARG are registers 1, 2, 3, and 4, a zero register ZERO is register 12, and a stack pointer register SP is register 15. As a control register, a link pointer LP is defined.

In alias definition, an alias of a register can be defined. If no alias is necessary, this definition is omitted. When alias definition is used, a user who wants to directly describe an assembly code can do it in accordance with his taste. For example, assume that when a register corresponding to the stack pointer SP is register 15, "SP" is defined as an alias of register 15. When "SP" is described in an assembly code, the assembler can recognize "SP" as register 15.

When the number of registers is small, some special use registers, e.g., a tiny pointer register TP (not shown) is sometimes handled as a general-purpose register. When this register is used as a tiny pointer, "TP" is described. To use this register as a general-purpose register, the register number is described. With this description, whether the register is used as a tiny pointer or a general-purpose register can be discriminated by the assembly code. Hence, highly maintainable assembly code can be formed.

On the basis of information described in the configuration designation file, the compiler, assembler, simulator, debugger, verification vector, and the like are customized. That is, as shown in FIG. 12, the register use method and the alias of a register are supplied to the compiler customizing section. The name and alias of a register are supplied to the assembler customizing section. Register names are transferred to the RTL generating section, simulator customizing section, verification vector generating section, and debugger generating section.

For example, the compiler customizing section generates a compiler on the basis of the information of general-purpose registers and control register defined in the register defining section. This compiler has definition of a register pseudo variable capable of directly accessing each register. When the register pseudo variable is used, the user can directly access each register of a processor using a high-level language.

In the configuration designation file, an accumulator and shift amount register can also be defined.

FIG. 15 shows definition of an accumulator. In this example, two 256-bit accumulators are present.

FIG. 16 shows definition of a shift amount register. In this example, two shift amount registers are present.

According to the second embodiment, the user can change the way to use the registers of the compiler in accordance with an application. For example, when an immediate "0" is often used in an application, a register which always takes a value "0" is prepared whereby no instruction for generating the immediate "0" needs to be generated. For this reason, both the code size and the execution performance can be improved.

When "0" is rarely used in an application, no register which always takes a value "0" is prepared whereby the number of registers for other application purposes is increased. For this reason, the frequency of memory access due to shortage in the number of registers can be reduced. Both the code size and the execution performance can be improved.

The register definition has default setting. When the user has omitted the register use method, the default use method is set. As described above, when the default use method of the compiler is employed, the user can measure the performance of an application. With reference to the measured performance, a better register use method can be designated.

The compiler also has definition of a register pseudo variable. For this reason, the user can use a register pseudo variable to access all registers described in the register definition in the high-level language. The register pseudo variable is useful in accessing a special register such as a control register in the high-level language. The register pseudo variable may be used together with the inline assemble function of the compiler. Hence, a function of preparing a register pseudo variable of all registers is effective.

The register defining section also has alias definition. The register name can be defined in accordance with the user's taste. Hence, convenient and maintainable assembly code can be formed.

(Third Embodiment)

The third embodiment of the present invention will be described next. The third embodiment is related to VLIW.

Instruction operation related to VLIW is defined by the instruction defining section in a configuration designation file as the architecture DB file. The instruction defining section describes specifications, operation code (Opcode), and operation contents of an instruction. On the basis of the specification and opcode information of an instruction, an assembler define file for defining the operation of the assembler is generated. On the basis of the definition of the operation contents, information that is not described in the specification definition of the instruction and is required for executing the instruction is collected. The collected information is applied to a machine instruction function definition. The information required for executing the instruction includes information regarding a high register, a low register and an accumulator. The information on such elements does not appear in instruction mnemonics but is required for data reading or writing. Hence, the compiler can do better register assignment and instruction scheduling.

The configuration designation file can also define a coprocessor. A coprocessor can be connected to a processor core such as an RISC core, like processor 2 shown in FIG. 7. Examples of coprocessors are a VLIW (Very Long Instruction Word) mode and DSP (Digital Signal Processor).

FIG. 17 shows coprocessor definition. To discriminate this definition from a core instruction, the definition has information representing coprocessor definition as an architecture type. That is, the name and type of a coprocessor are described. After this description, register definition and instruction definition are defined as related information of coprocessor definition. As the related information of coprocessor definition, in addition to the register definition and instruction definition, the presence/absence of mounting of the VLIW mode (absence, 2-parallel, or 3-parallel) and arithmetic data width definition (the width of data guaranteed during coprocessor operation) are present.

When the VLIW mode is mounted, information (V3 in FIG. 17) representing the slot position of a coprocessor instruction in the VLIW mode is contained in the instruction set definition. This slot definition is determined depending on use of a processor. In parallelizing instructions, information representing the slot position of an instruction is defined.

On the basis of this information, the machine instruction function define file related to a coprocessor instruction is generated. The compiler customizing section can parallelize a coprocessor instruction defined by the user on the basis of the machine instruction function define file. The assembler customizing section can check on the basis of the machine instruction function define file whether the parallelizing is correct for use.

The slot information is supplied to the verification vector generating section. The verification vector generating section generates a verification vector necessary for verifying the operation of the processor for the parallelized instruction on the basis of the slot information.

When a temporary variable or code extension operation is present in the operation definition of an instruction, arithmetic definition width information represents the number of bits to be processed by a simulator as the bit width of the temporary variable or the bit width after code extension. This width information depends on the bit width of a register defined in the register defining section of a coprocessor. For example, when the arithmetic width of a register of a coprocessor is designated as 64 bits, arithmetic definition width information can designate 64 bits at maximum. The arithmetic definition width information is supplied to the simulator customizing section and reflected on the simulator.

According to the third embodiment, the user can have the define file of a machine instruction function for all defined instructions. For this reason, when the machine instruction function is used, the user can obtain a compiler register assignment, instruction scheduling, and the VLIW parallelizing function. This is very useful for development of an application.

Slot definition has information representing the slot position of an instruction to be parallelized. For this reason, an instruction expressed as a machine instruction function can be packed in a proper slot, or the assembler can use that proper slot. Hence, application development by the user can be promoted.

In addition, information of slot definition to be used in parallelizing an instruction is reflected in the machine instruction function definition. For this reason, when a VLIW mode is mounted, in parallelizing a user-defined coprocessor instruction, information representing the slot position of the instruction is supplied to the machine instruction function definition. Hence, the compiler can accurately parallelize the VLIW for the machine instruction function. Since the machine instruction function can be used in the high-level language, application development by the user can be promoted.

Arithmetic definition width information is reflected in a simulator. For this reason, the simulator can match the instruction operation with the specifications of the processor. Hence, simulator operation can match with the actual processor operation.

Slot information is reflected in an assembler. For this reason, the assembler can check whether the parallelized portion of an instruction in an assembly code directly manually described by the user matches the specifications.

Slot information is also reflected in a verification vector. For this reason, a verification vector necessary for verifying the operation of the processor for a parallelized instruction can be obtained.

(Fourth Embodiment)

The fourth embodiment of the present invention will be described next. The fourth embodiment is related to a DSP.

As a function of incorporating a DSP as a user-defined module, a configuration designation file has an identifier for discriminating between a DSP and other modules. Definition related to a DSP is described in the identifier. In instruction definition of a DSP, an instruction having an arbitrary bit width can be defined. In register definition, a register having an arbitrary bit width can be defined.

FIG. 18 shows a DSP module configuration designation file. An architecture discriminating identifier "DSP_NAME" is described at the top. In addition, register width definition "REG_WIDTH" is added to the register defining section <dsp_register>. In this example, the register width is set to 20 bits. In the instruction defining section <dsp_ISA>, an instruction of 20 bits is defined.

The DSP module configuration designation file can also describe information for designating the position of the decimal point of a fixed decimal library (not shown). This information is supplied to the compiler customizing section and reflected in the fixed decimal library of the compiler.

The DSP module configuration designation file can also describe a function special to the DSP of the compiler. This function is a function for coping with at least one of, e.g., complex data type, X/Y memory, circulating buffer, fixed decimal data type, bit inversion, and a register set of different kinds.

According to the fourth embodiment, the configuration designation file includes a description that the processor is a DSP type, and hardware designation is a DSP instruction form. In the DSP instruction form, the bit width of an instruction can be set. For this reason, the user can flexibly set the bit width of an instruction in accordance with the use purpose of an application. Hence, the user can set a DSP corresponding to requested performance and reduce unnecessary cost.

In the DSP instruction form, the register width can be set. For this reason, the user can flexibly set the bit width of a register in accordance with the use purpose of an application. Hence, the user can set a DSP corresponding to requested performance and reduce unnecessary cost.

The fixed decimal library of a compiler generally flexibly copes with the position of the fixed decimal point. This degrades the performance. In this embodiment, however, since information for designating the position of the decimal point in the fixed decimal library is reflected in the fixed decimal library of the compiler, any degradation in performance can be prevented.

The user can use a function special to the DSP of the compiler. For this reason, the development period of an application can be shortened. In addition, the performance of an application can be improved.

(Fifth Embodiment)

The fifth embodiment is related to SIMD (Single Instruction Multiple Data). The fifth embodiment allows a user to describe processes of a plurality of data of SIMD altogether and generate a simulator from the description or cope with a multimedia data type.

When an instruction can process SIMD data, pieces of information representing that SIMD data is to be processed are described in the instruction defining section in a configuration designation file. The pieces of information include, e.g., the data length to be processed by an instruction and the data length of each instruction operand. This information designates the SIMD data width and is used to generate a machine instruction function definition and SIMD data extension declarator of a high-level language. With this processing, the user can easily process SIMD data. A description example is shown below.

CPPACK.B: CRo, CRq, CRp:
Cop:"SIMD=B, Pack=B:H:H":

In the above example, the data length of the "CPPACK.B" instruction is 8 bits. That is, when a register has 64 bits, 8-parallel processing is executed, and the register width is the same as the coprocessor register width in the register defining section. In addition to "B", "H" (half word, i.e., 16 bits) or "W" (word, i.e., 32 bits) can be designated. In accordance with the presence/absence of "U", signed and unsigned data are discriminated. For example, when "BU" is described, it represents 8-bit unsigned data.

Designation "Pack=B:H:H" represents that the operands "CRo, CRq, CRp" of the "CPPACK.B" instruction are 8-bit, 16-bit, and 16-bit signed data, respectively.

FIG. 19 shows instruction definition of "CPADD.H" in a SIMD instruction. Assume that the coprocessor register of a coprocessor for which this instruction is defined has, e.g., a 64-bit width. The data length of the instruction is "SIMD=H", i.e., 16 bits with a sign. In other words, this instruction calculates 16-bit data by 4-parallel processing. "PACK=H,H,H" signifies that the operands "CR1, CRm, CRn" of this instruction are 16-bit signed data. The operation definition indicates that the instruction adds 16-bit signed data by 4-parallel processing. These pieces of information are supplied to the compiler customizing section and simulator customizing section. In the compiler customizing section, these pieces of information are reflected in generation of a high-level language extension declarator of the compiler, generation of a machine instruction function, register assignment, and instruction scheduling function. In the simulator customizing section, these pieces of information are reflected in the simulator operation and simulator result output function.

In the example shown in FIG. 19, the operation description of a SIMD instruction for adding 16-bit signed data by 4-parallel processing is described in four lines. However, the operation description can be described in one line.

An example of the description is as follows.

$$CR1.h=CRm.h+CRn.H; \quad (1)$$

In example (1), ".h" is a description corresponding to "PACK=H,H,H".

FIG. 20 shows a description example of one line.

When the description of "PACK" is, e.g., "PACK=HU.B.BU", example (1) becomes $$CR1.Hu=CRm.b+CRn.bu; \quad (2)$$

FIG. 21 shows a description example in one line.

When an index (subscript) "i" is used, a description in which the arrangements of data do not match can be simplified.

$$CR1[15:0]=CRm[63:48]+CRn[63:48];$$

$$CR1[31:16]=CRm[47:32]+CRn[47:32];$$

$$CR1[47:32]=CRm[31:16]+CRn[31:16];$$

$$CR1[63:48]=CRm[15:0]+CRn[15:0];$$

A simplified description example is $$CR1[i]=CRm[3-i]+CR[3-i]: \quad (3)$$

In example (3), the index "i" takes a value which depends on the instruction data width and coprocessor register width. When "SIMD=H", i.e., the data width of the coprocessor is 64 bits, the value of the index "i" is 0to 3.

FIG. 22 shows a description example which uses the index.

According to the fifth embodiment, information related to a SIMD instruction is described in the instruction defining section of a configuration designation file. For this reason, the compiler customizing section can generate a define file of a machine instruction function for generating a SIMD instruction can be generated on the basis of the information related to the SIMD instruction. Since the machine instruction function can be used in a high-level language, application development by the user can be promoted.

In addition, a special modifier for declaring SIMD data can be used in the high-level language. Hence, application development by the user can be promoted.

The simulator customizing section customizes the operation of a simulator on the basis of the received information related to the SIMD instruction. For this reason, a simulator which correctly operates for the SIMD instruction can be generated.

The simulator customizing section also customizes the result output function of the simulator on the basis of the received information related to the SIMD instruction. For this reason, a simulator output result that can easily be analyzed for a SIMD instruction can be generated.

Furthermore, for the operation description of a SIMD instruction, a plurality of instructions may be described as one instruction or described using an index. For this reason, the description of instruction operation of a SIMD instruction can be simplified. Hence, the description of instruction operation of a SIMD instruction can be made intuitively by the user.

(Sixth Embodiment)

The sixth embodiment is related to an instruction library.

A user can add an instruction suitable for the specifications of a configuration designation file. The system LSI development environment generating system holds defined instructions as a library. This will be referred to as an instruction library hereinafter. The instruction library is divided into groups in accordance with instruction types. When a user selects a necessary instruction from an instruction library, a development environment specialized for an application can be generated.

FIG. 23 shows a SIMD instruction library. Instructions in the SIMD instruction library are options. Configuration designation files and RTLs for these instructions are prepared independently of basic instructions. The user can select and use all the instructions or instructions of specific data type.

Referring to FIG. 23, one of mnemonic "UB, B, UH, H, UW, and W" is described in ".xx" as a data type used by an instruction. This description can be selected by the user. As shown in FIG. 23, the mnemonic description may be omitted. When the mnemonic is fixed to one of "UB, B, UH, H, UW, and W", it can be explicitly described in the following way. In this example, the mnemonic is fixed to "H".

CPADD.H//2-operand 32 bit addition (A<−A+B)

Even in the above description, when the mnemonic description is changed, the description can cope with the change.

FIG. 24 shows a method of generating a tool such as a complier from instruction libraries. When the user uses instructions of instruction libraries, for example, corresponding intermediate files IF1 and IF2 are generated from a plurality of instruction libraries ADB1 and ADB2. The intermediate files IF1 and IF2 are merged with an intermediate file IF3 of a basic instruction. When the merged intermediate file is incorporated in the compiler or the like, the entire environment is created.

In the above example, intermediate files are generated from the instruction libraries and merged. However, generation of the intermediate files can be omitted. Necessary instructions selected from the instruction libraries may be directly merged.

Alternatively, a function of assigning a type such as a slot information to an instruction may be set such that optimum scheduling performance can be obtained for an application requested by the user without changing the function of an instruction of a designated instruction library.

When a coprocessor is defined, a data transfer instruction between, e.g., the core processor and a coprocessor is always necessary. When an instruction (a reserved instruction) that always accompanies a main instruction is automatically merged with the main instruction, the compiler can efficiently generate an instruction of an instruction library from the source level of a high-level language. Alternatively, the reserved instruction may be described in an instruction library.

In the above-described example, a merged file is reflected in the compiler. However, the present invention is not limited to this. When a merged file is supplied to the RTL generating section, an assembly can be selected without changing the function of an instruction of a designated instruction library. For example, an RTL template can be generated with priority on size. With this arrangement, the size of a generated RTL can be minimized while maintaining the performance of an application. Hence, any increase in chip size can be suppressed, and the cost can be reduced.

In addition, by using high speed circuit, an RTL template can be generated with priority on performance without changing any function of an instruction of a designated instruction library. With this arrangement, the latency of an application can be reduced. Hence, the performance can be improved.

According to the sixth embodiment, the data type to be processed by an instruction described in an instruction library can be set for an application. For this reason, a processor having an instruction suitable for an application can be developed.

Even when the data type of an instruction described in an instruction library is determined in advance, it can be changed. For this reason, the instruction can be changed to an instruction suitable for an application.

In addition, when necessary instructions are selected from a plurality of instruction libraries, and are merged, one processor can be set. For this reason, a processor more suitable for the characteristics of an application can be generated.

(Seventh Embodiment)

In the seventh embodiment, a high-level operation description in a configuration designation file as an architecture DB file will be described.

As a high-level operation description in a configuration designation file, a description almost corresponding to "statement" of C language can be used. However, "!!" (bit connection), "[ ]" (partial bit extraction), and logic operators are different from those of C language. As a characteristic feature of the high-level operation description of this embodiment, a bit connection can be written on the left-hand side of an expression. In addition, the high-level operation description of this embodiment includes no concept of clock and describes the relationship between the values of registers and memories before execution of an instruction and those after execution of the instruction.

The difference or constraints of the high-level operation description of this embodiment are as follows.

No data type is present.
Variables can be used in accordance with a rule.
A bit constant can be written.
!! represents a bit connection.
[msb:1sb] represents partial bit extraction.
and, or, xor, nor, and nand are bit logic operators.
(Signed) and (Unsigned) represent cast operators.
In store operation, a function such as Mem Word ( ) can be written on the left-hand side.

(Usable Variables)
Operand variable
Register variable
Temporary variable (Operand Variable)

An operand variable is described in the operand (<operand>) of instruction definition and can be described in the following way.

<register designation>
<(abs) type><(abs) type>
<disp type><disp( ) type>
<cpx>(real number portion)(imaginary number portion) . . . complex number
<int> . . . integer
<flt> . . . floating point
<immediate type>

For these variables, the specifications of an instruction described in an immediately preceding operand must match alphanumerics representing parameters of registers and the bit width of a designator.

(Register Variable)

A register variable is a register other than an operand variable and can be described in the following way.

Specific notation (name designation or index notation by numerical value)
Examples: PC, SRRO, CCR3
Array designation
Example: identification character string+'['expression']'
Example: CTR[Imm4]
Note 1: identifier character string+index+'['numerical value']' is partial bit extraction.
Example: CTRn[4] is a partial bit. CTR[4] equals CTR4. CTR[Rn] [3:0] or the like can also be described.
Note 2: Indefinite notation (index notation by a parameter, Rm or the like) is classified into an operand variable. Indefinite notations other than operand variables are errors.

(Primary Variable)

A variable other than operand variables and register variables is a primary variable. As the name of a primary variable, the following names can be used.

A name according to the naming rule of a variable name of C language.
A name that is different from defined register names
A name that does not start with prefix of each designator of an operand variable.
A name that does not start with abs-, imm-, Imm-, disp-, code-, or target-.

(Constant):

Like Verilog, "ss . . . s'fnn . . . s" is set. "ss . . . s" represents the number of bits. When the number of bits is omitted, 32 bits is set. In this example, f is a base. D: decimal, h: hexadecimal, o: octal, b: binary. When these descriptions are omitted, decimal notation is used. "nn . . . n" is a constant value. When the constant value is smaller than number of bits, the upper bits are compensated by "0". When the constant value is larger than the number of bits, the number of bits is neglected. A delimiter "_" cannot be used in nn . . . n. For a base and constant value, capital letters can also be used.

Example:
3'b001: 3-bit binary number
32'Hff: 32-bit hexadecimal number (upper bits are 0-extended)
'o1234': 32-bit hexadecimal number (the number of bits is omitted; equal to 32'o1234)
1: 32-bit decimal number (the number of bits and base are omitted; equal to 32'd1)

10'5: 10-bit decimal number (the base is omitted; equal to 10'd5)

(Supplementation)

The following description is possible.

a=b=c+d;

Function invocation can also be written.
Function invocation can be written on the left-hand side.
MemWord(Rn)=a;
CTR[Imm4]=b;
Concatenation operator
!!: bit concatenation
Partial bit extraction
Designated by [msb:1sb]
Reserve function name
Memory access function
MemWord
MemDoubleWord
MemByte
MemHWord
MemDefaultSize
ControlBus
Bit extension function
SignExtension
ZeroExtension
Condition determination function
Overflow (Left-Hand Side Connection)

When bit connection is written on the left-hand side, the entire description is put in parentheses.
(HI!LO)=Rn*Rm;

(SIMD Description)

See the fifth embodiment.

(Error Check Function)

Representative error check function are as follows.
(1) Repetitive operation code check
(2) Matching between RO/RW and operation description of register operand, which is determined for each instruction form.
(3) Matching between SIMD description, Pack description, and operation description: When no operation description corresponding to the data width designated by SIMD and Pack is present, a warning is output. More specifically, the operation description is checked for each data width designated by SIMD/Pack. When partial bit reference/substitution of the following bit width is not present, a warning is output. The relationship between the data width and the bit width is as follows.

| Data Width | Bit Width (msb-1sb + 1) |
|---|---|
| B, UB | 8 |
| H, UH | 16 |
| W, UW | 32 |
| A | 8, 16, 32 |

(4) Reference to Temporary Variable with Undefined Value

When an expression with the first temporary variable is present on the right-hand side in an operation description, a warning is output.

(5) When a temporary variable with a defined value is not referred to, a warning is output.

FIG. 25 shows an instruction set defining section in a configuration designation file. This example shows definition of an LW instruction and SWAP instruction. In the operation description of the LW instruction (the portion in { }), "Rn" is a register-designated operand variable, "disp8" is a disp-type operand variable, and "SP" is a register variable. "ZeroExtension" and "MemWord" are reserve functions for bit extension and memory access. In addition, "tmp1" and "tmp2" in the SWAP instruction are temporary variables.

According to the seventh embodiment, a high-level description is possible for an instruction operation description in a configuration designation file. For this reason, a new instruction can easily be added, and an existing instruction can easily be analyzed. Hence, an instruction can easily be improved or maintained. Application development by the user can be promoted.

(Eighth Embodiment)

The eighth embodiment is related to a pipeline description.

Information for scheduling of a compiler and information for automatic generation of a hazard verification vector are generated from the following pipeline description.

A pipeline description includes "pipeline type definition" and "hazard information".

(1) Pipeline Type Definition

A format related to pipeline type definition is as follows.

PTYPE: <type name>: <resource>, <operation>, <timing>, <argument> [:<resource>, <operation>, <timing>, <argument>: . . . ];

Each PTYPE line must have at least one of the four variables "<resource>, <operation>, <timing>, and <argument>". An arbitrary number of sets of four variables can be continuously described by delimiting them with ":".

The four variables in the PTYPE line have the following meanings. "Resource" indicates a register or the like, "operation" indicates read/write, "timing" indicates a stage of pipeline, and "argument" is an index for an operand (register or the like). That is, the PTYPE line indicates that an operation for a resource occurs at a pipeline stage.

Figures 26, 27, 28, 29:
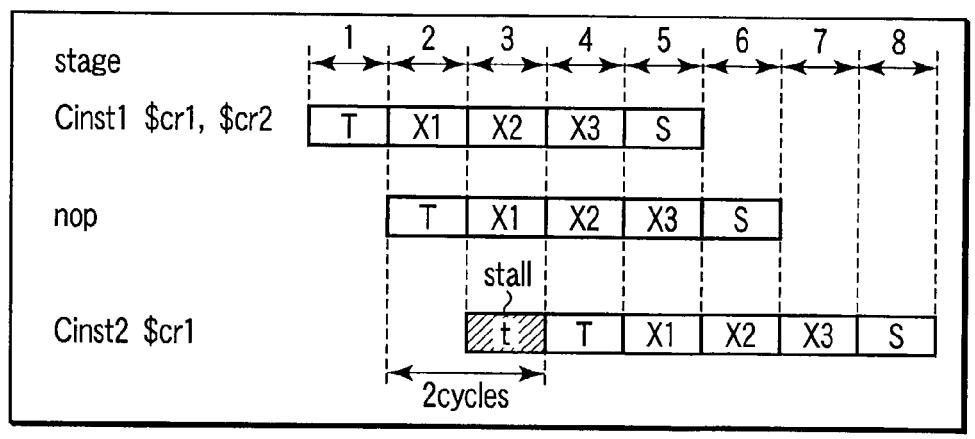
FIG. 26 is a view showing a description example of a PTYPE line.
FIG. 27 is a view showing a description example of hazard information.
FIG. 28 is a view showing hazard information and pipeline operation.
FIG. 29 is a view showing scheduling information for a complier.

FIG. 26 shows a description example of a PTYPE line.

(2) Hazard Information

Hazard information has the following format.

HAZARD: <resource>: <operation 1> (type name 1), <operation 2> (type name 2)=<number of cycles>;

This indicates the number of stalls when, in a resource, a preceding instruction of type 1 executes operation 1, and a succeeding instruction of type 2 executes operation 2.

FIG. 27 shows a description example of hazard information. In this hazard information, a general-purpose register of a given coprocessor is write-accessed by an instruction of pipeline type "pt1". After that, if the same register is to be read-accessed by an instruction of pipeline type "pt2", processing must wait for two cycles.

The number of stalls when an instruction sequence in which a hazard occurs is executed on a simulator is determined by the hazard information and pipeline definition designated for each instruction.

For example, FIG. 28 shows operation when instruction "cinst1" is of pipeline type "pt1", and instruction "cinst2" is of pipeline type "pt2".

In the hazard information shown in FIG. 27, a general-purpose register of a given coprocessor is write-accessed by an instruction of pipeline type "pt1". After that, if the same register is to be read-accessed by an instruction of pipeline type "pt2", processing must wait for two cycles. In the example shown in FIG. 28, a general-purpose register "$cr1" of a coprocessor is write-accessed by instruction "cinst1" at stage "T". After processing waits for two cycles, the same register is read-accessed by instruction "cinst2". In this case, instruction "cinst2" stalls in the simulator for one cycle.

(Scheduling Information for Compiler)

FIG. 29 shows scheduling information for a complier.

In the example shown in FIG. 29, an instruction of PTYPE2 immediately after an instruction of PTYPE1 stalls for three cycles, and an instruction of PTYPE3 immediately after the instruction of PTYPE2 stalls for four cycles. From this information, a compiler executes scheduling to set a 3-instruction interval between PTYPE1 and PTYPE2 and a 4-instruction interval between PTYPE1 and PTYPE3 as much as possible.

(Pipeline Operation Description for Hazard Verification Vector Generation)

FIG. 30 shows an example of a pipeline operation description.

This operation description is formed from pipeline definition and explicit stall designation. A detailed description of the description and verification vector generation therefrom will be omitted.

According to the eighth embodiment, a configuration designation file can contain a description of pipeline definition. For this reason, a pipeline can be formed. In addition, a pipeline definition can contain a definition of pipeline type and hazard information.

A configuration designation file can also contain scheduling information for a compiler in association with a pipeline. Hence, a compiler can schedule pipeline operation on the basis of the scheduling information.

A configuration designation file can also contain a description for hazard verification vector generation in association with a pipeline. Hence, hazard in a pipeline can be reliably verified.

(Ninth Embodiment)

The ninth embodiment is related to synthesis of an RTL.

FIG. 31 shows high-level synthesis of a user-defined module by the RTL generating section shown in FIG. 6. In high-level synthesis of a user custom instruction shown in FIG. 31, in addition to normal hardware resource assignment and scheduling, matching and generation of an interface (I/F) between a core section and control path and a memory are executed.

Figures 32, 33, 34:
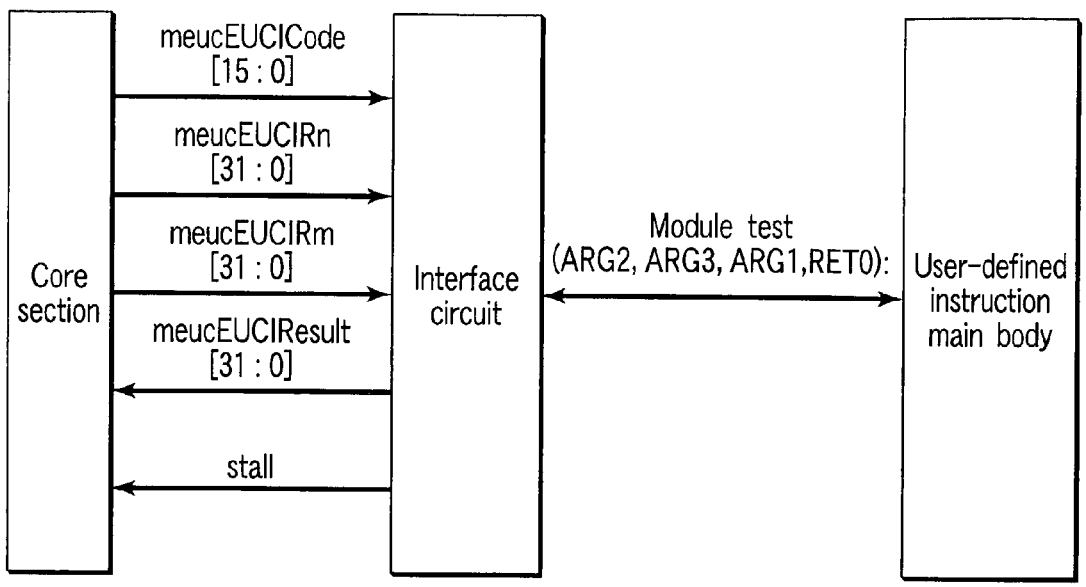
FIG. 32 is a view showing an interface matching method.
FIG. 33 is a view showing an ISA information generating method and instruction definition related to an instruction CPXOR3.
FIG. 34 is a view showing automatically generated ISA information.

FIG. 32 shows an interface matching method in synthesizing a user custom instruction. An RTL of an instruction main body is generated by high-level synthesis, as shown in FIG. 31. In this case, an interface circuit is generated between the instruction main body and the core section. Connection between the core section and the interface circuit is expressed by a signal of an input/output register field, 16-bit operand signal, and stall signal. The instruction main body is described in a form invoked from the interface circuit. Connection between the instruction main body and the interface circuit is expressed by an argument "module".

According to the ninth embodiment, normal hardware resource assignment, scheduling, and matching of an interface between the core section and control path and a memory are performed to do high-level synthesis of a user custom instruction.

(10th Embodiment)

The 10th embodiment is related to verification vector generation.

A method of generating data for generating an AVP (Architecture Verification Program) from the above-described configuration designation file will be described.

(Data Necessary for Generating AVP)

A verification program used to verify the function of a single instruction of a processor will be particularly called an AVP. ISA information is used to generate the AVP. The following data is necessary for ISA information.

Mnemonic
Operand list
Operand information
Operand type (register/immediate)
Bit width of an operand
When an operand is a register, the presence/absence of reference/substitution (ISA Information Generating Method)

A method of generating ISA information from an architecture database file will be described. In a register defining section, the number of registers and the bit width of each register are defined for each register type. An instruction defining section is formed from a mnemonic, operand list, and instruction operation defining section. An instruction operation defining section defines instruction operation by describing a statement using an operand in the operand list, a register which is not included in the register list, a temporary variable, a constant, and the like.

FIG. 33 shows instruction definition related to, e.g., an instruction CPXOR3. The instruction CPXOR3 represents that CRo, CRq, and CRp must be described as register operands. The prefix of a register name changes depending on the register type. A register whose name starts with "CR" is a general-purpose register of a coprocessor. A portion between "{" and "}" is an instruction operation describing section. In this example, a result obtained by calculating the XOR between two coprocessor general-purpose registers CRp and CRq for each bit is substituted into CRo.

As described above, the instruction defining section has mnemonic information and operand list information. These pieces of information are directly used as mnemonic information and operand list information of ISA information. In the operand list, a list of operand names is described. Of operand names, Imm*, Imm* is immediate. The remaining operand names indicate registers. When this rule is used, the type of each operand can be acquired from the operand list.

Information of each operand is acquired in the following way. When an operand is a register, the bit width of the register is acquired from register defining information. When an operand is an immediate one, the bit width of the immediate opened is acquired from an operand code. More specifically, of the character string of the operand code, the number of "i"s corresponds to the bit width of the immediate.

When an operand is a register, the presence/absence of reference/substitution of an operand is acquired by analyzing the syntax of the instruction operation description.

When the above method is executed by a program, ISA information shown in FIG. 34 can be automatically generated from the instruction defining section shown in FIG. 33 and the register information shown in FIG. 14.

(Data Use Method)

The ISA information is used to generate a verification program described by an assembler. The mnemonic and operand list are used to generate an inspection target instruction code in the verification program. Operand information of each operand is used for the following purposes.

When an operand is an immediate operand, immediate data for inspection is generated using information of a bit width. When an operand is a register operand and the value of the register is referred to, a value to be given to the register is generated from information of a bit width or the like. A code to be set for the register is generated from the resultant value. A value can be generated by several methods.

As the first method, a value is generated at random within the range of a settable bit width (numerical value including a sign).

As the second method, a region where input can be set (for 2-input, a region on a 2D plane) is obtained, and the region is sequentially subdivided. The barycenter coordinates of a subdivided region are used as input values.

By the second method, a point in a region can be reliably selected. When points on and near a boundary are selectively generated as input data, the boundary condition can be inspected.

Details of a method of generating a verification program for verifying individual instruction operations from ISA information will be omitted for the descriptive convenience.

When an operand is a register operand, and a value is substituted into the register, a code for outputting an arithmetic result of the instruction substituted into the register to a log file is generated. A verification program shown in FIG. 35 is automatically generated from the ISA information shown in FIG. 34.

According to the 10th embodiment, the verification vector generating section can generate a verification vector for a processor from an operation instruction of a configuration designation file. For this reason, the operation of the processor can be reliably verified. This contributes to LSI development by the user.

(11th Embodiment)

The 11th embodiment is related to simulator generation.

A method of generating a simulator from a configuration designation file will be described.

Figure 36:
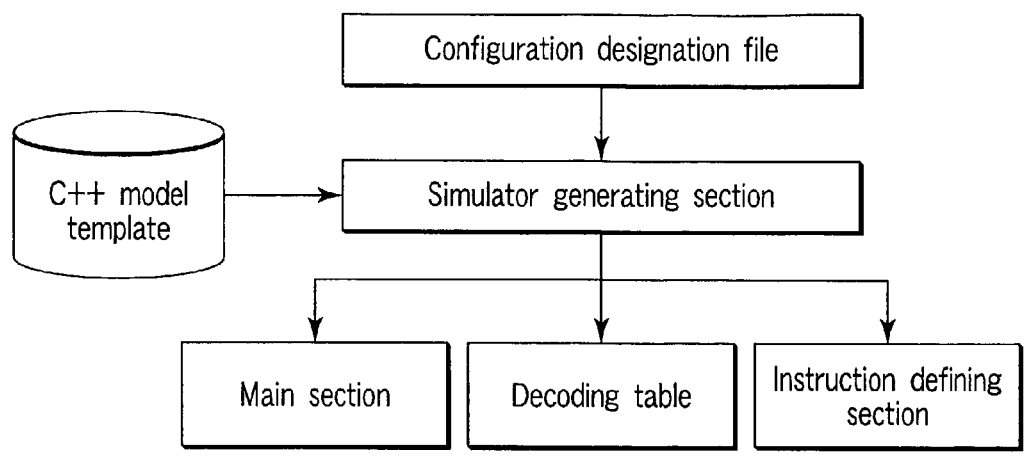
FIG. 36 is view schematically showing the operation of the simulator generating section.

FIG. 36 schematically shows the operation of the simulator generating section. The simulator generating section generates a simulator on the basis of a configuration designation file and a C++ model template prepared in advance. That is, the simulator generating section sets necessary information in the C++ model template, thereby generating the main section, decoding table, and instruction defining section of a simulator. The main section is generated on the basis of the header field and register declaration section of a configuration designation file. The decoding table and instruction defining section are generated on the basis of the ISA section of the configuration designation file.

A decoding table is a conversion table for converting the bit pattern of a code section in a program into an instruction sequence. A C++ model template is a template used to generate a C++ source code of a simulator. When the simulator generating section substitutes necessary information into this template, a C++ model is generated.

The main section stores information related to the entire simulator, such as a usable instruction format, the numbers and sizes of general-purpose registers and control registers, and inter-instruction hazard.

The decoding table stores an operation code section of each instruction definition of the ISA section of the configuration designation file. A decoded instruction in a simulator is generated by comparing the operation code section of the table with the operation code section of an instruction and identifying the instruction.

The instruction defining section is generated by mainly converting an operation description of the configuration designation file into a C++ description of equivalent operation. In addition, pieces of information such as the pipeline type, the format of a trace output, the presence/absence of code extension of an immediate operand, and the transfer direction of data transferred between a core processor register and a coprocessor register are also added to the instruction defining section.

A method of adding information of transfer direction is as follows.

Information of transfer direction is defined as one of attributes for instruction definition. This is described in the following way in the coprocessor model file (input of=mkcop) of the simulator generating section.

```
{name                    =>'ICMOV',
    cname                =>'CMOV_1',
    instType             =>'t64c_al',
    instSubType=>'core_cop',
    #<=transfer from coprocessor general-purpose
    register to core general-purpose register
    regsbit              =>'true',
    opcodeA              =>'0xf',
    opcodeB              =>'0x0',
    opcodeC              =>'0x0',
    opcodeD              =>'0x1',
    func=>'
            # operation description
        ',
},
```

The operation description is generated basically by converting a variable into a C++ variable and converting an operator into an equivalent C++ operator in a one-to-one correspondence. A read/write of a register or memory or a reserve function is generated by invoking an API function of a simulator prepared in advance.

For some expressions that are not present in C++, the operation description is converted before conversion to C++. For example, bit connection described on the left-hand side of an expression is converted in the following manner.

(before conversion)

(A!!B)=Expression;

(after conversion)

TMP=Expression;

B=TMP[(B most significant·B least significant·1) :0];

A=TMP[(A most significant+B most significant·1):(B most significant·B least significant)];

(TMP is a temporary variable)

A SIMD notation is expanded as described in the fifth embodiment.

For a trace output, a register in which a value is written by its instruction operation is output. The presence/absence of a write in the register is determined by analyzing whether the register appears on the left-hand side of the instruction operation description. For data transfer between registers, a register that appears on the left-hand side is determined as a write register, and a register that appears on the right-hand side is determined as a read register. It is regarded that data is transferred from a read register to a write register.

According to the 11th embodiment, a necessary simulator can be generated in accordance with the description of the configuration designation file. Hence, the user can simulate an application and know its performance in a short time. For this reason, the period of system LSI development can be shortened.

(12th Embodiment)

The 12th embodiment is related to generation of a debug environment.

The following three items are set for debug environment generation.

(1) Register Definition:

A debugger requires information about displayable and rewritable registers. This information is generated by the register defining section of a configuration designation file. Displayable registers correspond to all defined registers. A rewritable register (part of register) or a field of the register is described as, e.g., "rw" in the register definition shown in FIG. 14. The register described as "r" cannot be rewritten by the debugger.

(2) Reverse Assembler

A debugger executes reverse assembly for an execution program and describes it. The reverse assembler recognizes an instruction by the same method as that of the decoding section of a simulator and displays its mnemonic.

(3) Debug Monitor

A debug monitor sets the initial value of a register at the start of debug. Information of a register (a register that is present) for which the initial value is to be set is obtained from the register defining section of a configuration designation file.

According to the 12th embodiment, a debug environment is generated from a configuration designation file. For this reason, the user can obtain a debug environment necessary for LSI development. Hence, the user can debug an application and shorten the application development period.

The present invention is not limited to the above embodiments.

Figure 37:
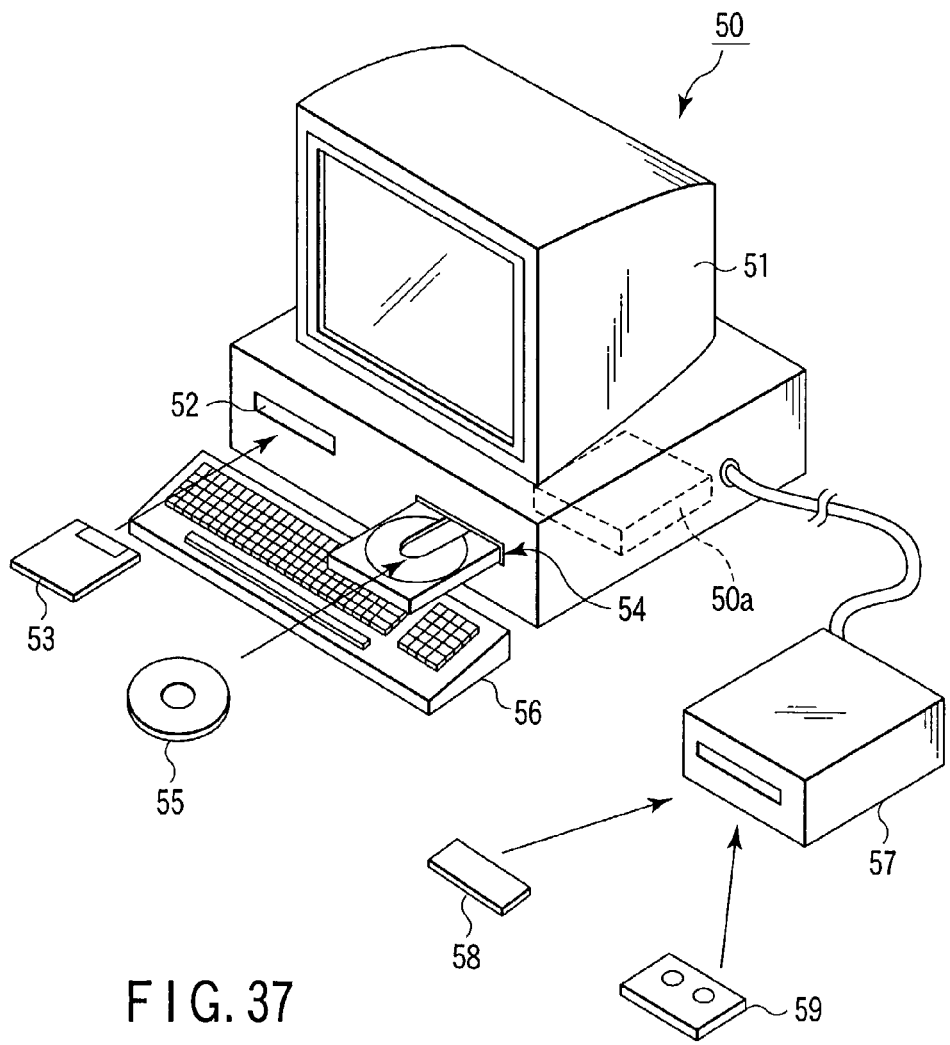
FIG. 37 is a perspective view showing an outline of the system LSI development environment generating system.

FIG. 37 shows an outline of a system LSI development environment generating system to which the above embodiments are applied. A system LSI development environment generating apparatus 50 includes a so-called general-purpose computer, workstation, PC (Personal Computer), and NC (Network Computer). The system LSI development environment generating apparatus 50 has a hard disk device 50*a* (not shown).

The system LSI development environment generating apparatus 50 also has, e.g., a floppy disk drive 52 and optical disk drive 54. A floppy disk 53 is loaded into the floppy disk drive 52. An optical disk 55 is loaded into the optical disk drive 54.

A drive device 57 connected to the system LSI development environment generating apparatus 50 is a reader/writer of, e.g., a memory card 58 or a reader/writer of a magnetic tape cartridge 59. By the drive device 57, the memory card 58 or magnetic tape cartridge 59 can be accessed.

Programs of the above-described command interpreter, RTL generating section, simulator customizing section, compiler customizing section, assembler customizing section, verification vector generating section, and debugger generating section or files such as a configuration designation file are stored on recording media such as the floppy disk 53, optical disk 55, memory card 58, and magnetic tape cartridge 59. When these programs and files are read out and installed in the hard disk device 50*a*, the above-described operation can be executed. As a recording medium, a transfer medium may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of generating a development environment for developing a system LSI, the development environment including a compiler customizing section, an assembler customizing section, and a simulator, said method comprising:

causing the compiler customizing section to customize a compiler, the assembler customizing section to customize an assembler, and a simulator generating section to generate the simulator, on the basis of information of a configuration designation file in which a configuration of a system LSI is described, the configuration designation file containing a register definition which defines at least the number of general-purpose registers and information of a register use method by the compiler and a description for designating one of a plurality of defined architectures, the description including a Very Long Instruction Word (VLIW) mode.

2. The method according to claim 1, wherein when the information is omitted, the compiler customizing section sets a default register use method of the compiler.

3. The method according to claim 1, wherein the compiler customizing section generates an information of a register pseudo variable capable of directly accessing a register on the basis of the information of the register definition.

4. The method according to claim 1, wherein the register definition has a register alias definition which is supplied to the assembler customizing section.

5. The method according to claim 1, wherein the development environment further includes at least one of an RTL generating section, verification vector generating section, and debugger generating section.

6. The method according to claim 5, wherein the register definition contains a register name which is supplied to at least one of the RTL generating section, verification vector generating section, and debugger generating section.

7. The method according to claim 5, wherein the register definition contains a register name which is supplied to at least one of the compiler customizing section, assembler customizing section, and simulator generating section.

8. The method according to claim 7, wherein the register name is indicated in the simulator and the debugger, respectively.

9. The method according to claim 1, wherein the configuration designation file contains mnemonic of instruction, operand code, and operation contents.

10. The method according to claim 1, wherein the compiler customizing section generates a machine instruction function definition on the basis of information of an instruction defining section.

11. The method according to claim 10, further comprising:

supplying a slot information for parallelizing an instruction to the compiler customizing section, and reflecting to the machine instruction function definition.

12. The method according to claim 1, wherein in the configuration designation file, a processor is of VLIW type, and designation of the hardware contains designation of an instruction slot form of a VLIW.

13. The method according to claim 12, wherein the configuration designation file contains a slot definition to discriminate a slot position of an instruction in parallelizing the instruction.

14. The method according to claim 12, wherein the slot information is supplied to the assembler customizing section and reflected in the assembler.

15. The method according to claim 12, wherein the slot information is supplied to the verification vector generating section and reflected in a verification vector.

16. The method according to claim 1, wherein the configuration designation file includes a designation of hardware that contains a description of a DSP instruction form.

17. The method according to claim 16, wherein the configuration designation file contains information which designates an instruction with a bit width.

18. The method according to claim 16, wherein the configuration designation file contains information which defines a register with a bit width.

19. The method according to claim 16, wherein the configuration designation file contains information which designates a position of a decimal point of a fixed decimal library, and the compiler customizing section supplies the information to the fixed decimal library of the compiler.

20. The method according to claim 16, wherein when the processor is of DSP type, the configuration designation file includes a function corresponding to a DSP of the compiler.

21. The method according to claim 20, wherein a function corresponding to a DSP of the compiler includes at least one of complex data type, X/Y memory region, circulating buffer, fixed decimal data type, bit inversion, and a register set of different kinds.

22. The method according to claim 20, wherein the compiler customizing section customizes so as to generate an operation command by the compiler when a DSP type processor has the fixed decimal point operation command, and customizes so as to use a library for fixed decimal point operation by the compiler when the DSP type processor has the no fixed decimal point operation command.

23. The method according to claim 1, wherein the configuration designation file includes a designation of hardware that contains a description of a SIMD instruction form.

24. The method according to claim 23, wherein the compiler customizing section generates a SIMD data extension declarator on the basis of information related to an input SIMD instruction.

25. The method according to claim 23, wherein the compiler customizing section generates an information of a special data type on the basis of information related to an input SIMD instruction.

26. The method according to claim 23, wherein the simulator customizing section customizes operation of the simulator on the basis of information related to an input SIMD instruction.

27. The method according to claim 23, wherein the simulator customizing section customizes a simulator result output function on the basis of information related to an input SIMD instruction.

28. The method according to claim 23, wherein in an operation description of a SIMD instruction, a plurality of instructions are described together as one instruction.

29. The method according to claim 23, wherein an operation description of a SIMD instruction is described using an index.

30. The method according to claim 1, wherein the information includes an information of a function return value register.

31. The method according to claim 1, wherein the information includes an information of an argument register.

32. The method according to claim 1, wherein the information includes an information of a register which is handed over to a function called by a function call.

33. The method according to claim 1, wherein the information includes an information of a register which is not handed over to a function called by a function call.

34. The method according to claim 1, wherein only a register described in the register definition makes generating the assembler possible.

35. The method according to claim 1, wherein only a register described in the register definition can simulate, and a register name is reflected to a trace output of a simulation result.

36. The method according to claim 1, wherein only a register described in the register definition is accessable, and is indicated in a window.

37. The method according to claim 1, wherein a verification vector is generated by using a register described in the register definition.

38. A method of generating a development environment for developing a system LSI, the development environment including a compiler customizing section, an assembler customizing section, and a simulator, said method comprising:
analyzing an input command; and
causing the compiler customizing section to customize a compiler, an assembler customizing section to customize an assembler, and a simulator generating section to generate a simulator, in accordance with the analyzed command, on the basis of information of a configuration designation file in which a configuration of the system LSI is described, and
the configuration designation file containing a high-level description and a register definition which defines at least the number of general-purpose registers and information of a register use method by the compiler and a description for designating one of a plurality of defined architectures, the description including a Very Long Instruction Word (VLIW) mode.

39. The method according to claim 38, wherein a temporary variable or a bit width of a value after code extension in an instruction operation description is designated in accordance with specifications of a processor, and the information is supplied to the simulator customizing section and reflected in the simulator.

40. The method according to claim 38, further comprising:
selecting necessary instructions from a plurality of instruction libraries including a plurality of defined instructions; and
merging the selected instructions to generate a development environment corresponding to an application,
wherein the development environment includes a compiler customizing section which generates a compiler, an assembler customizing section which generates an assembler, and a simulator generating section which generates a simulator.

41. The method according to claim 40, further comprising after the necessary instructions are selected from the plurality of instruction libraries, generating an intermediate library for each instruction library and merging the intermediate libraries.

42. The method according to claim 40, further comprising after the necessary instructions are selected from the plurality of instruction libraries, generating an intermediate library for each instruction library and merging the intermediate libraries and an intermediate file of a basic instruction.

43. The method according to claim 40, wherein an instruction in the instruction library can select a data type to be used by the instruction.

44. The method according to claim 40, wherein an instruction in the instruction library can change a data type to be used by the instruction.

45. The method according to claim 38, wherein the high-level description contains at least operation descriptions about bit connection, partial bit extraction, function form, sign cast operator, temporary variable, and overflow.

46. The method according to claim 38, wherein the high-level description can describe bit connection on a left-hand side of an expression.

47. The method according to claim 38, wherein the configuration designation file contains a description of a pipeline definition.

48. The method according to claim 47, wherein the description of the pipeline definition contains a definition of pipeline type.

49. The method according to claim 47, wherein the description of the pipeline definition contains hazard information.

50. The method according to claim 38, wherein the configuration designation file contains instruction scheduling information for the compiler in association with a pipeline.

51. The method according to claim 38, wherein the configuration designation file contains a description for hazard verification vector generation in association with a pipeline.

52. The method according to claim 38, wherein an RTL is generated from the high-level description.

53. The method according to claim 52, wherein an interface matching section executes hardware resource assignment, scheduling, and matching of the interface between the core section and control bus and the memory from an operation instruction, thereby generating the RTL.

54. The method according to claim 38, wherein the configuration designation file includes a designation of hardware that contains a description of a DSP instruction form.

55. The method according to claim 54, wherein the configuration designation file contains information which designates an instruction with a bit width.

56. The method according to claim 54, wherein the configuration designation file contains information which defines a register with a bit width.

57. The method according to claim 54, wherein the configuration designation file contains information which designates a position of a decimal point of a fixed decimal library, and the compiler customizing section supplies the information to the fixed decimal library of the compiler.

58. The method according to claim 54, wherein when the processor is of DSP type, the configuration designation file includes a function corresponding to a DSP of the compiler.

59. The method according to claim 58, wherein a function corresponding to a DSP of the compiler includes at least one of complex data type, X/Y memory region, circulating buffer, fixed decimal data type, bit inversion, and a register set of different kinds.

60. The method according to claim 58, wherein the compiler customizing section customizes so as to generate an operation command by the compiler when a DSP type processor has the fixed decimal point operation command, and customizes so as to use a library for fixed decimal point operation by the compiler when the DSP type processor has the no fixed decimal point operation command.

61. The method according to claim 54, wherein the designation of hardware contains a description of a SIMD instruction form.

62. The method according to claim 61, wherein the compiler customizing section generates a SIMD data extension declarator on the basis of information related to an input SIMD instruction.

63. The method according to claim 61, wherein the compiler customizing section generates an information of a special data type on the basis of information related to an input SIMD instruction.

64. The method according to claim 61, wherein the simulator customizing section customizes operation of the simulator on the basis of information related to an input SIMD instruction.

65. The method according to claim 61, wherein the simulator customizing section customizes a simulator result output function on the basis of information related to an input SIMD instruction.

66. The method according to claim 61, wherein in an operation description of a SIMD instruction, a plurality of instructions are described together as one instruction.

67. The method according to claim 61, wherein an operation description of a SIMD instruction is described using an index.

68. A computer readable medium with a program which generates a development environment for developing a system LSI, the development environment including a compiler customizing section, an assembler customizing section, and a simulator, said method comprising:
  causing a computer to analyze an input command; and
  customizing a compiler by the compiler customizing section,
  customizing an assembler by the assembler customizing section, and
  generating a simulator by the simulator generating section, in accordance with the analyzed command, on the basis of information of a configuration designation file, the configuration designation file containing a high-level description and a register definition which defines at least the number of general-purpose registers and information of a register use method by the compiler and a description of hardware that contains a description of a Single Instruction Multiple Data (SIMD) instruction form.

69. The medium according to claim 68, wherein when the information is omitted, the compiler customizing section sets a default kind of register used by of the compiler.

70. The medium according to claim 68, wherein the compiler customizing section generates an information of a register pseudo variable capable of directly accessing a register on the basis of the information of the register definition.

71. The medium according to claim 68, wherein the register definition has a register alias definition which is supplied to the assembler customizing section.

72. The medium according to claim 68, wherein the development environment further includes an RTL generating section, verification vector generating section, and debugger generating section.

73. The medium according to claim 72, wherein the register definition contains a register name which is supplied to at least one of the RTL generating section, verification vector generating section, and debugger generating section.

74. The medium according to claim 72, wherein the RTL generating section includes at least one of a scheduling section which performs hardware resource assignment and scheduling, an interface matching section which matches an interface between a core section and control path and a memory, and a conversion section which changes C language into Verilog.

75. The medium according to claim 68, wherein the configuration designation file contains mnemonic of instruction, operand code, and operation contents.

76. The medium according to claim 68, wherein the compiler customizing section generates a machine instruction function definition on the basis of information of an instruction defining section.

77. The medium according to claim 76, further comprising:
supplying a slot information for parallelizing an instruction to the compiler customizing section, and reflecting to the machine instruction function definition.

78. The medium according to claim 68, wherein in the configuration designation file, a processor is of VLIW type, and designation of the hardware contains designation of an instruction slot form of a VLIW.

79. The medium according to claim 78, wherein the configuration designation file contains a slot definition to discriminate a slot position of an instruction in parallelizing the instruction.

80. The medium according to claim 78, wherein the slot information is supplied to the assembler customizing section and reflected in the assembler.

81. The medium according to claim 78, wherein the slot information is supplied to the verification vector generating section and reflected in a verification vector.

82. The medium according to claim 68, wherein the information includes an information of a function return value register.

83. The medium according to claim 68, wherein the information includes an information of an argument register.

84. The medium according to claim 68, wherein the information includes an information of a register which is handed over to a function called by a function call.

85. The medium according to claim 68, wherein the information includes an information of a register which is not handed over to a function called by a function call.

86. The medium according to claim 68, wherein the register definition contains a register name which is supplied to at least one of the compiler customizing section, assembler customizing section, and simulator generating section.

87. The medium according to claim 86, wherein the register name is indicated in the simulator and the debugger, respectively.

88. The medium according to claim 68, wherein only a register described in the register definition makes generating the assembler possible.

89. The medium according to claim 68, wherein only a register described in the register definition can simulate, and a register name is reflected to a trace output of a simulation result.

90. The medium according to claim 68, wherein only a register described in the register definition is accessable, and is indicated in a window.

91. The medium according to claim 68, wherein a verification vector is generated by using a register described in the register definition.

92. A computer readable medium with a program which generates a development environment for developing a system LSI, the development environment including a compiler customizing section, an assembler customizing section, and a simulator, said method comprising:
causing a computer to analyze an input command; and
customizing a compiler by the compiler customizing section, customizing an assembler by the assembler customizing section, and generating a simulator by the simulator generating section, in accordance with the analyzed command, on the basis of information of a configuration designation file, the configuration designation file containing a high-level description and a register definition which defines at least the number of general-purpose registers and information of a register use method by the compiler and a description of hardware that contains a description of a Single Instruction Multiple Data (SIMD) instruction form.

93. The medium according to claim 92, wherein a bit width of a temporary variable or a value after code extension in an instruction operation description is designated in accordance with specifications of a processor, and the information is supplied to the simulator customizing section and reflected in the simulator.

94. The medium according to claim 92, further comprising:
causing a computer to select necessary instructions from a plurality of instruction libraries including a plurality of defined instructions; and
causing a computer to merge the selected instructions to generate a development environment corresponding to an application,
wherein the development environment includes a compiler customizing section which generates a compiler, an assembler customizing section which generates an assembler, and a simulator generating section which generates a simulator.

95. The medium according to claim 94, further comprising after the necessary instructions are selected from the plurality of instruction libraries, generating an intermediate library for each instruction library and merging the intermediate libraries.

96. The medium according to claim 95, wherein an instruction in the instruction library can change a data type to be used by the instruction.

97. The medium according to claim 94, further comprising after the necessary instructions are selected from the plurality of instruction libraries, generating an intermediate library for each instruction library and merging the intermediate libraries and an intermediate file of a basic instruction.

98. The medium according to claim 94, wherein an instruction in the instruction library can select a data type to be used by the instruction.

99. The medium according to claim 92, wherein the high-level description contains at least operation descriptions about bit connection, partial bit extraction, function form, sign cast operator, temporary variable, and overflow.

100. The medium according to claim 92, wherein the high-level description can describe bit connection on a left-hand side of an expression.

101. The medium according to claim 92, wherein the configuration designation file contains a description of a pipeline definition.

102. The medium according to claim 101, wherein the description of the pipeline definition contains a definition of pipeline type.

103. The medium according to claim 101, wherein the description of the pipeline definition contains hazard information.

104. The medium according to claim 92, wherein the configuration designation file contains instruction scheduling information for the compiler in association with a pipeline.

105. The medium according to claim 92, wherein the configuration designation file contains a description for hazard verification vector generation in association with a pipeline.

106. The medium according to claim 92, wherein an RTL is generated from the high-level description.

107. The medium according to claim 106, wherein the interface matching section executes hardware resource assignment, scheduling, and matching of the interface between the core section and control bus and the memory from the operation instruction, thereby generating an RTL. register name is indicated in the simulator and the debugger, respectively.

108. The medium according to claim 92, further comprising an RTL generating section including at least one of a scheduling section which performs hardware resource assignment and scheduling, an interface matching section which matches an interface between a core section and control path and a memory, and a conversion section which changes C language into Verilog.

* * * * *